(12) United States Patent
Tezuka et al.

(10) Patent No.: US 10,043,808 B1
(45) Date of Patent: Aug. 7, 2018

(54) SEMICONDUCTOR MEMORY

(71) Applicant: Toshiba Memory Corporation, Minato-ku (JP)

(72) Inventors: Tsutomu Tezuka, Yokohama (JP); Fumitaka Arai, Yokkaichi (JP); Keiji Ikeda, Kawasaki (JP); Tomomasa Ueda, Yokohama (JP); Nobuyoshi Saito, Tokyo (JP); Chika Tanaka, Fujisawa (JP); Kentaro Miura, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/705,457

(22) Filed: Sep. 15, 2017

(30) Foreign Application Priority Data

Mar. 16, 2017 (JP) ................. 2017-051388

(51) Int. Cl.
*H01L 29/76* (2006.01)
*H01L 27/105* (2006.01)
(Continued)

(52) U.S. Cl.
CPC ...... *H01L 27/1052* (2013.01); *G11C 11/4097* (2013.01); *H01L 29/7869* (2013.01);
(Continued)

(58) Field of Classification Search
CPC ............... H01L 29/7926; H01L 29/792; H01L 27/1052; H01L 29/7869
(Continued)

(56) References Cited

U.S. PATENT DOCUMENTS 5,936,274 A * 8/1999 Forbes ................ G11C 11/5621
257/314
8,866,139 B2 10/2014 Ino
(Continued)

FOREIGN PATENT DOCUMENTS

JP 2007-73969 3/2007
JP 2011-258303 12/2011
(Continued)

OTHER PUBLICATIONS

Hiroki Inoue, et al., "Nonvolatile Memory With Extremely Low-Leakage Indium-Gallium-Zinc-Oxide Thin-Film Transistor", IEEE Journal of Solid-State Circuits, vol. 47, No. 9, 2012, pp. 8.
(Continued)

*Primary Examiner* — Theresa T Doan
(74) *Attorney, Agent, or Firm* — Oblon, McClelland, Maier & Neustadt, L.L.P.

(57) ABSTRACT

According to one embodiment, a semiconductor memory includes: a first gate of a first select transistor and a second gate of a second select transistor on a gate insulating film on a semiconductor layer; an oxide semiconductor layer above the semiconductor layer; a first control gate of a first cell and a second control gate of a second cell on an insulating layer on the oxide semiconductor layer; a third gate of a first transistor between the first control gate and the second control gate; a fourth gate of a second transistor between a first end of the oxide semiconductor layer and the second control gate; an interconnect connected to the first end; a source line connected to the first select transistor; and a bit line connected to the second select transistor.

19 Claims, 21 Drawing Sheets

(51) Int. Cl.
*H01L 29/792* (2006.01)
*H01L 29/786* (2006.01)
*G11C 11/4097* (2006.01)
*H01L 29/423* (2006.01)

(52) U.S. Cl.
CPC ........ *H01L 29/792* (2013.01); *G11C 2216/06* (2013.01); *H01L 29/42332* (2013.01); *H01L 29/42348* (2013.01)

(58) Field of Classification Search
USPC .......................................... 257/314
See application file for complete search history.

(56) References Cited

U.S. PATENT DOCUMENTS 8,980,699 B2 * 3/2015 Tang .................. H01L 27/1027
257/E21.35

| 2007/0064468 | A1 | 3/2007 | Seol et al. |
| 2011/0280061 | A1 | 11/2011 | Saito et al. |
| 2013/0285051 | A1 | 10/2013 | Tanaka |

FOREIGN PATENT DOCUMENTS

| JP | 2013-187362 | 9/2013 |
| JP | 2013-251533 | 12/2013 |
| JP | 2015-128192 | 7/2015 |

OTHER PUBLICATIONS

Takanori Matsuzaki, et al., "Multilevel Cell Nonvolatile Memory with Field-effect Transistor Using Crystalline Oxide Semiconductor", ECS Transactions, vol. 64(14),2014, pp. 11.

Yoshimitsu Yamauchi, et al., "Study of Novel Floating-Gate Oxide Semiconductor Memory Using Indium-Gallium-Zinc Oxide for Low-Power System-on-Panel Applications", Japanese Journal of Applied Physics, vol. 52, 2013, pp. 9.

* cited by examiner

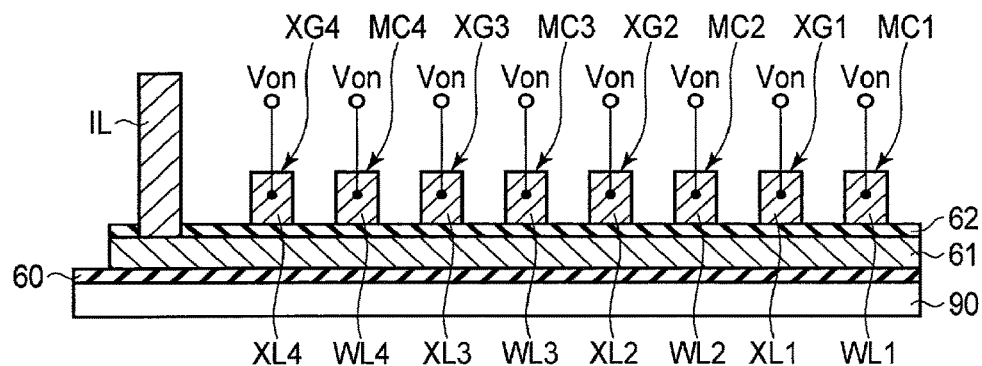
F I G. 5A
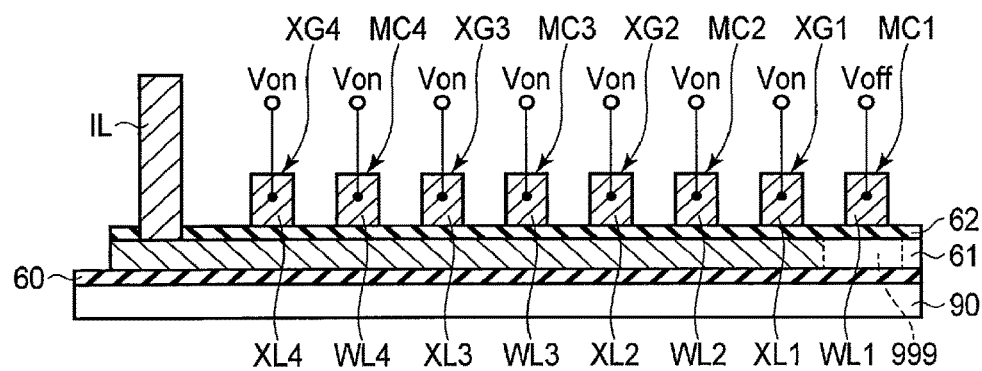
F I G. 5B
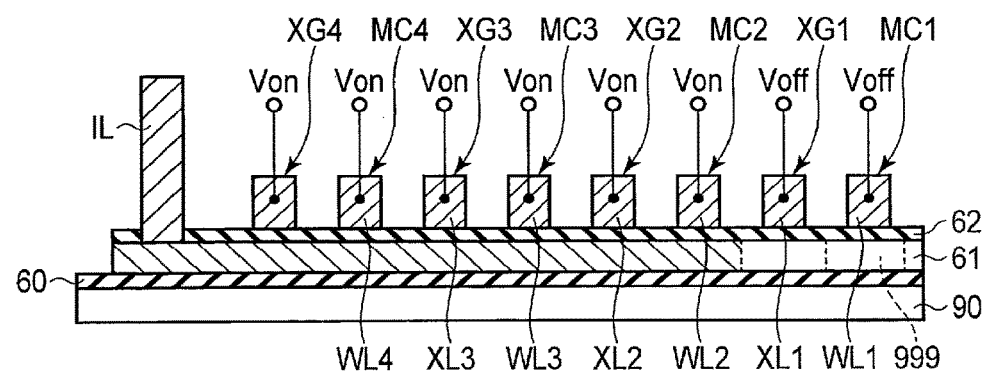
F I G. 5C

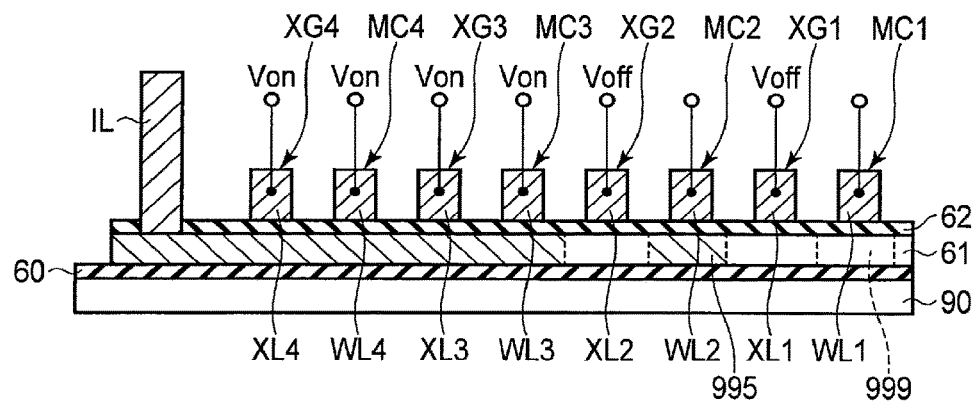
F I G. 5D
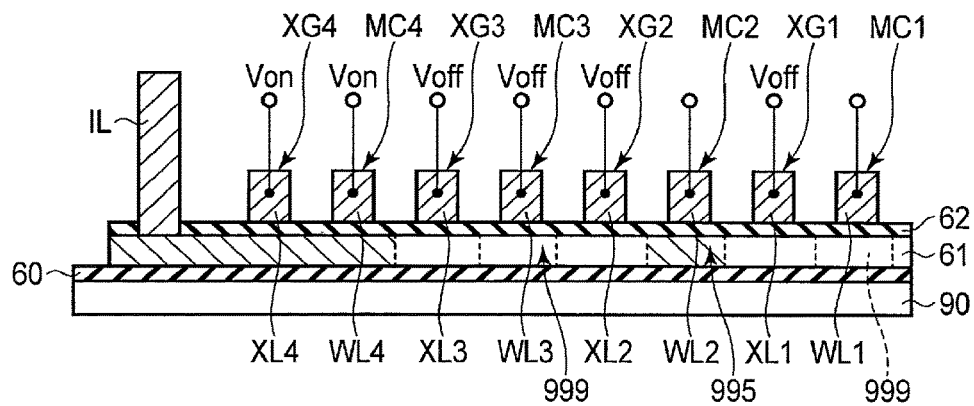
F I G. 5E

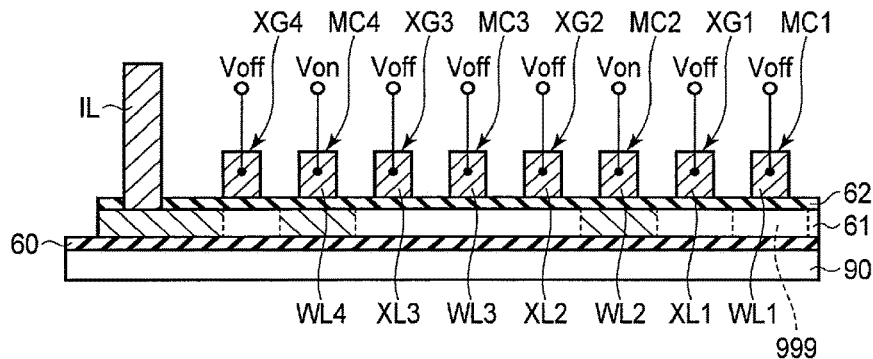
F I G. 6F
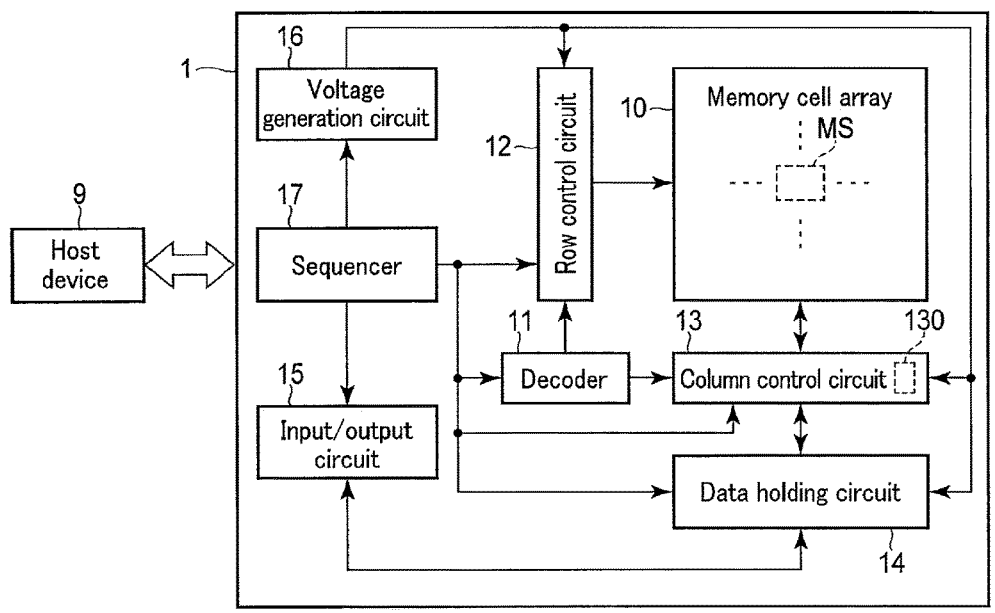
F I G. 7

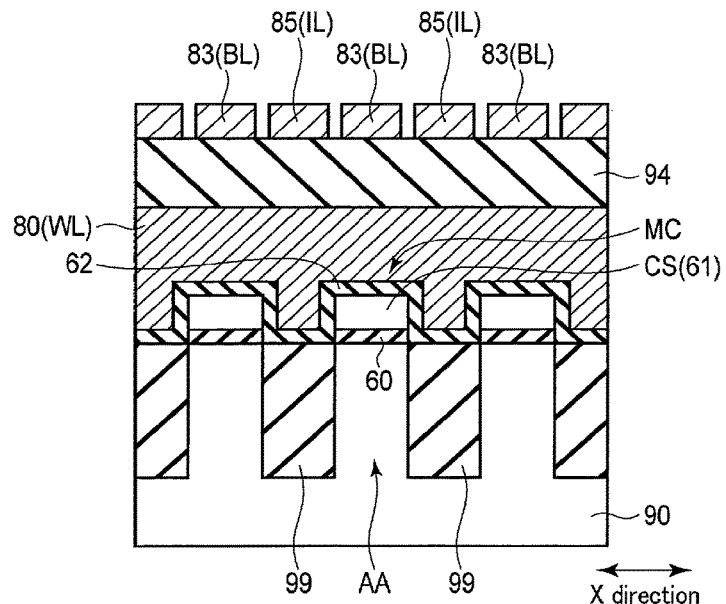
F I G. 10
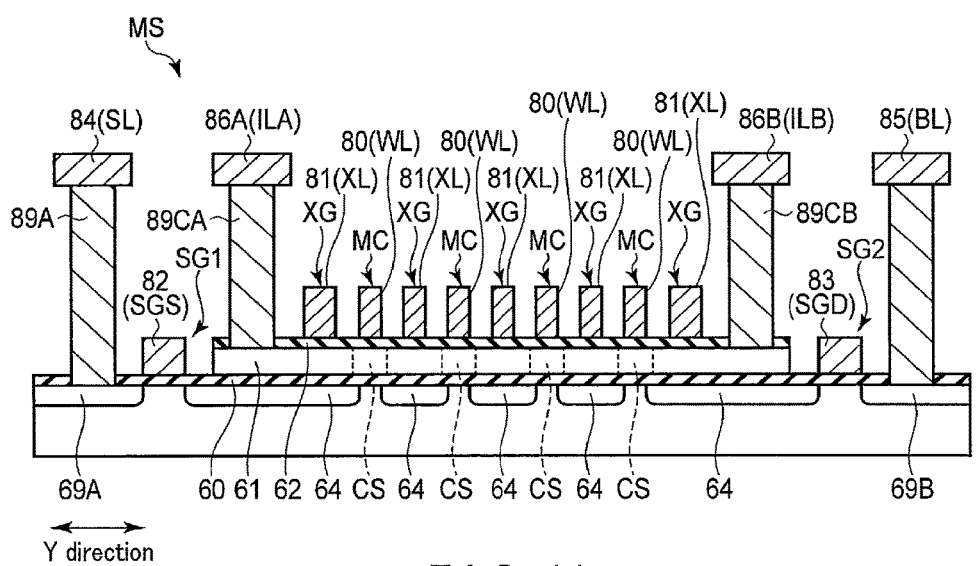
F I G. 11

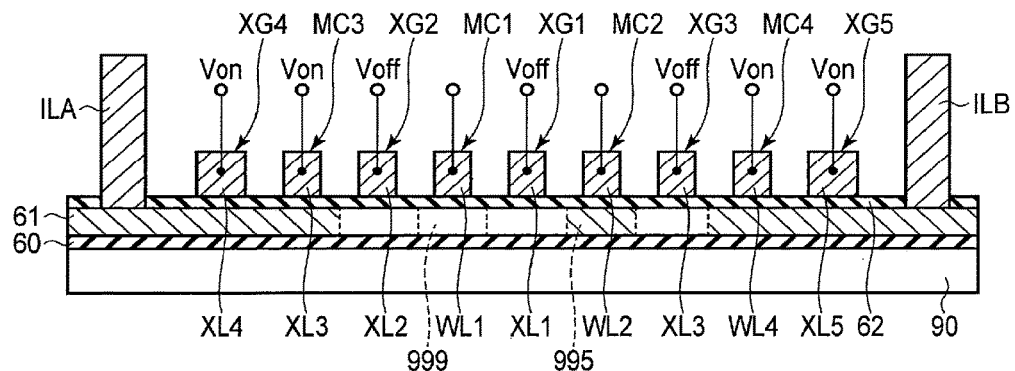
F I G. 13D
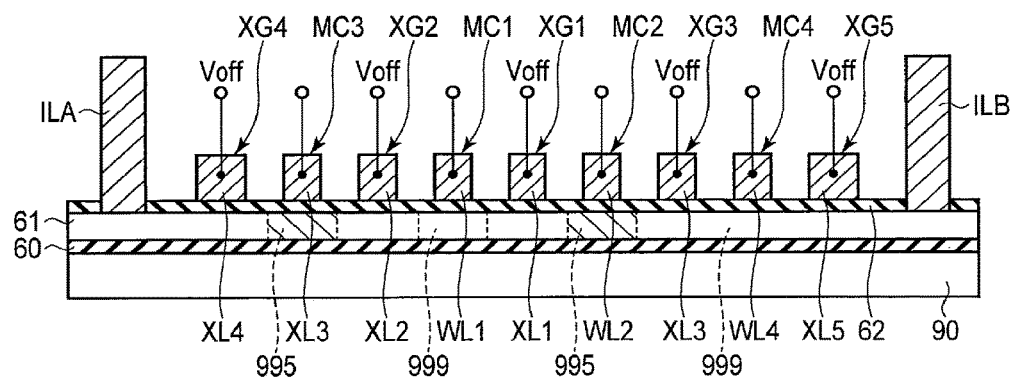
F I G. 13E

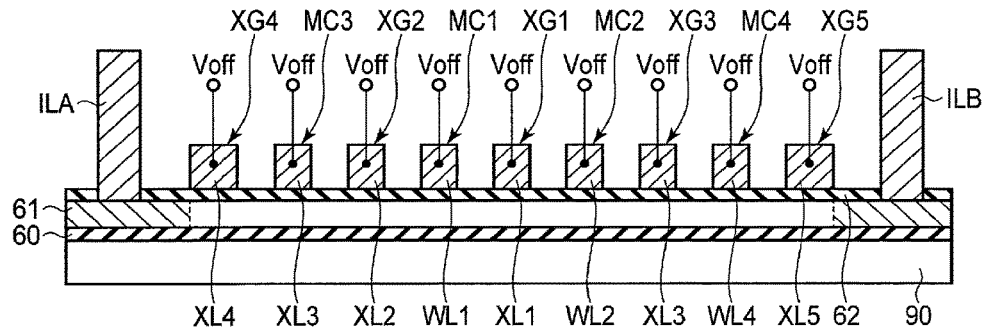
F I G. 14A
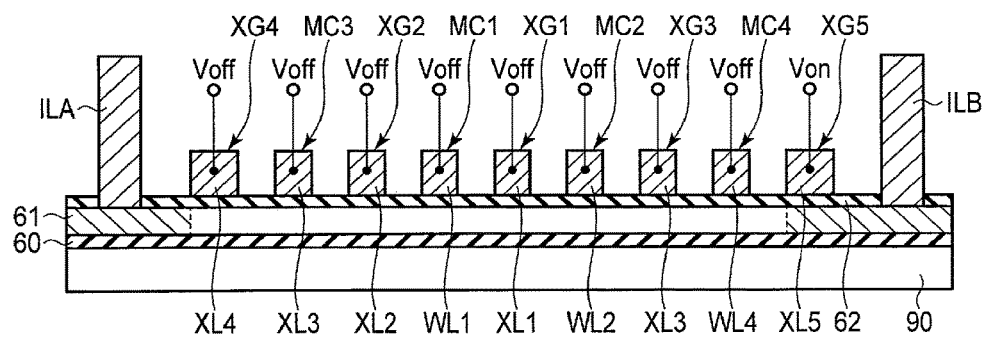
F I G. 14B

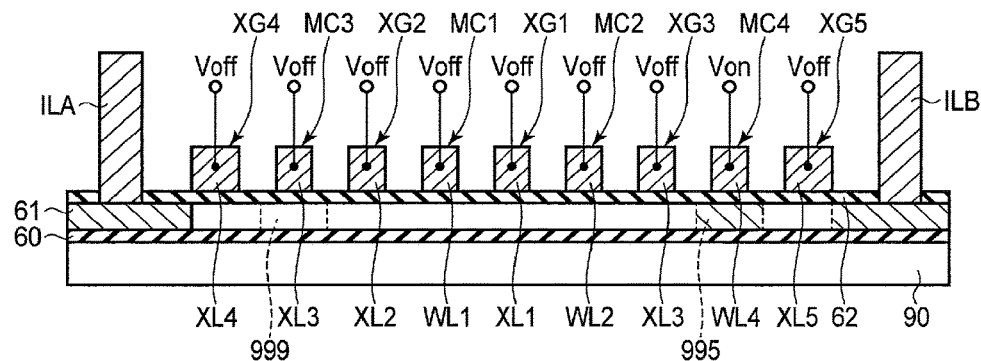
F I G. 14C
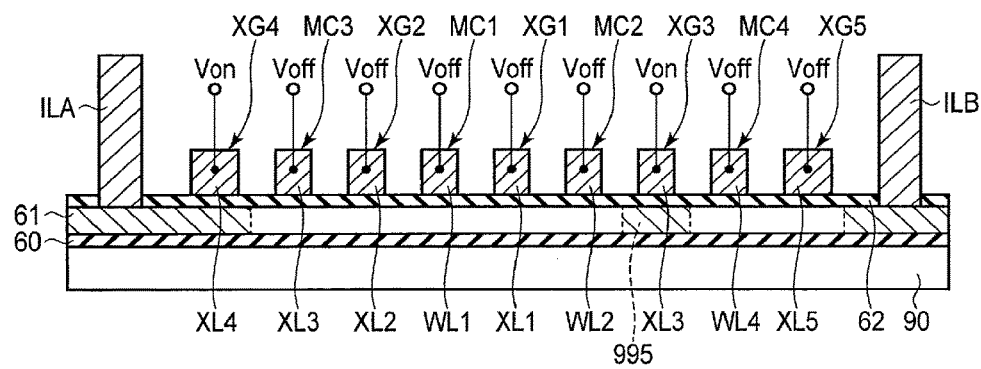
F I G. 14D

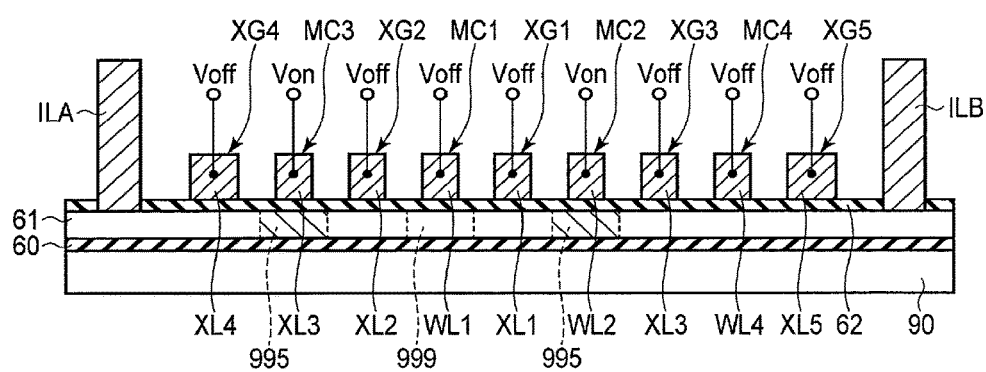
F I G. 14E

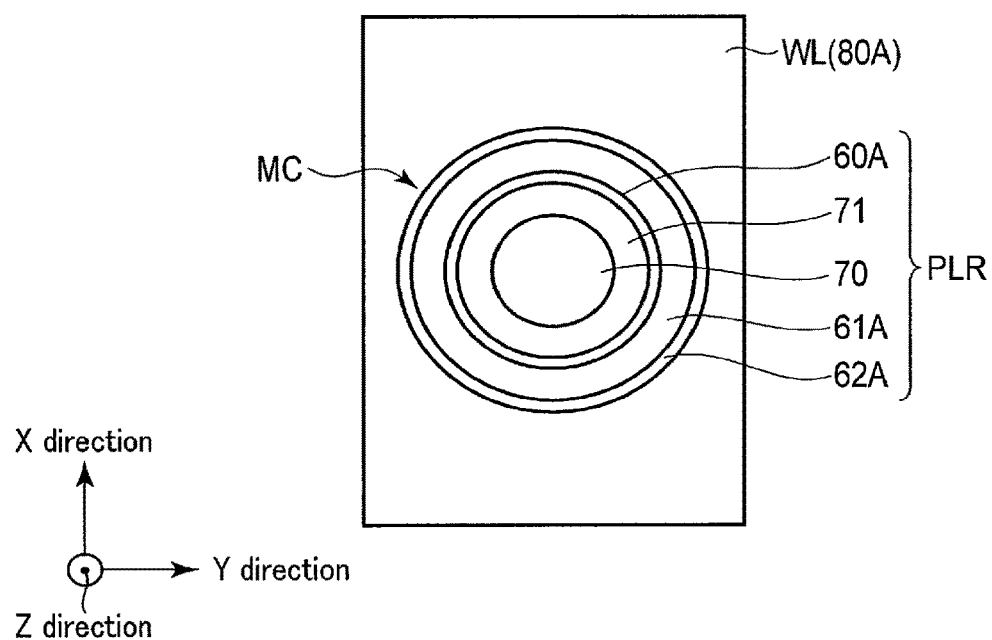
F I G. 16

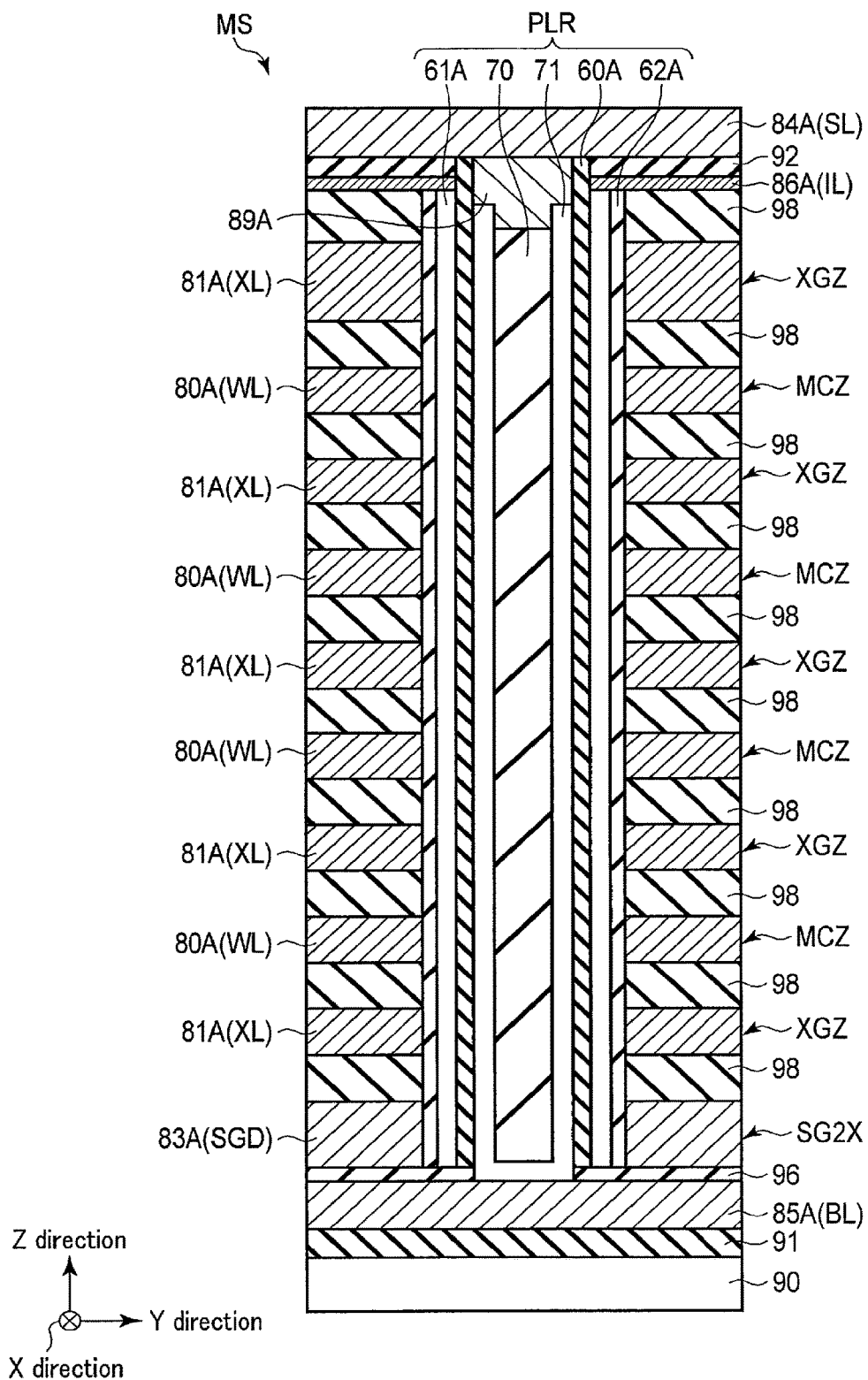
F I G. 18

SEMICONDUCTOR MEMORY

CROSS-REFERENCE TO RELATED APPLICATIONS

This application is based upon and claims the benefit of priority from Japanese Patent Application No. 2017-051388, filed Mar. 16, 2017, the entire contents of which are incorporated herein by reference.

FIELD

Embodiments described herein relate generally to a semiconductor memory.

BACKGROUND

In recent years, the amount of data handled at information terminals and on the Internet and clouds has been increasing explosively. The explosive increase has led to demands for an increase in the capacity of memory devices and a reduction in bit cost.

Ideal memory devices are nonvolatile semiconductor memory which is high in operating speed and storage density and which is low in bit cost. At present, no memory device meeting all these demands is present, and memory devices suitable for individual intended purposes are provided to users.

BRIEF DESCRIPTION OF THE DRAWINGS

FIG. 5A, FIG. 5B, FIG. 5C, FIG. 5D, FIG. 5E, and FIG. 5F are diagrams illustrating operation examples of the semiconductor memory of the first embodiment;

FIG. 6A, FIG. 6B, FIG. 6C, FIG. 6D, FIG. 6E, and FIG. 6F are diagrams illustrating operation examples of the semiconductor memory of the first embodiment;

FIG. 7 is a block diagram illustrating a specific example of the semiconductor memory of the first embodiment;

FIG. 10 is a cross-sectional view illustrating the specific example of the semiconductor memory of the first embodiment;

FIG. 11 is a cross-sectional view illustrating a semiconductor memory of a second embodiment;

FIG. 13A, FIG. 13B, FIG. 13C, FIG. 13D, and FIG. 13E are diagrams illustrating operation examples of the semiconductor memory of the second embodiment;

FIG. 14A, FIG. 14B, FIG. 14C, FIG. 14D, and FIG. 14E are diagrams illustrating operation examples of the semiconductor memory of the second embodiment;

FIG. 16 is a top view illustrating the semiconductor memory of the third embodiment;

FIG. 18 is a cross-sectional view illustrating a modification of the semiconductor memory of the third embodiment.

DETAILED DESCRIPTION

Figure 1:
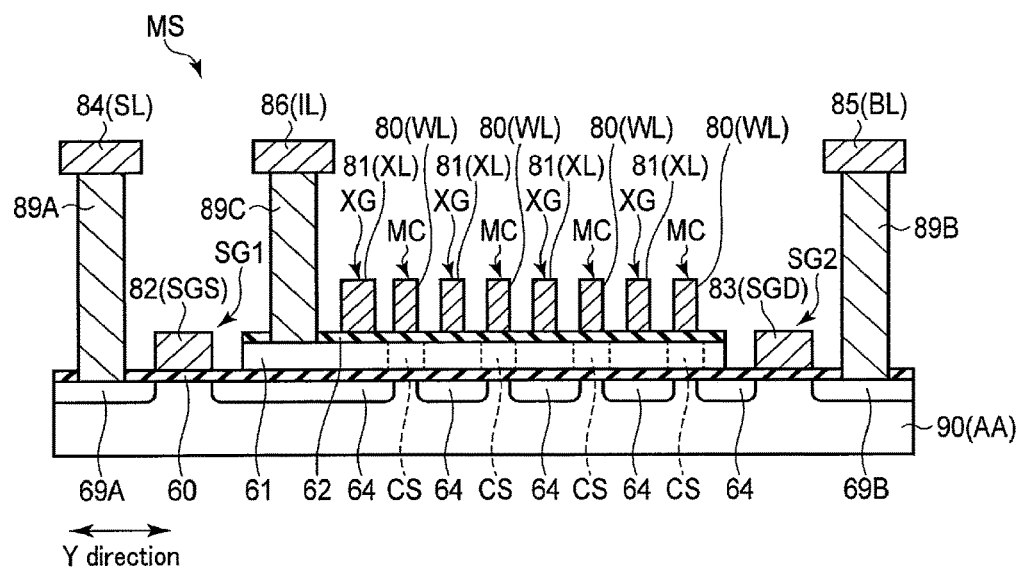
FIG. 1 is a cross-sectional view illustrating a basic example of a semiconductor memory of a first embodiment.

In general, according to one embodiment, a semiconductor memory comprising: a semiconductor layer; a gate insulating film on the semiconductor layer; a first gate electrode of a first select transistor on the gate insulating film; a second gate electrode of a second select transistor on the gate insulating film; an oxide semiconductor layer disposed above the semiconductor layer between the first and second select transistors via the gate insulating film; an insulating layer on the oxide semiconductor layer; a first control gate electrode of a first memory cell on the insulating layer; a second control gate electrode of a second memory cell on the insulating layer; a third gate electrode of a first transistor on the insulating layer between the first control gate electrode and the second control gate electrode; a fourth gate electrode of a second transistor on the insulating layer between a first end of the oxide semiconductor layer and the second control gate electrode; a first interconnect connected to the first end of the oxide semiconductor layer; a source line connected to a first terminal of the first select transistor; and a bit line connected to a second terminal of the second select transistor.

Embodiments

With reference to FIG. 1 to FIG. 18, semiconductor memories of embodiments will be described. Elements having the same functions and configurations are hereinafter denoted by the same reference numerals. When components (for example, word lines WL and bit lines BL, and various voltages and signals) with numbers or alphabets added to the ends of the reference numerals thereof for distinction are not distinguished from one another, reference numerals with the numbers or alphabets at the ends omitted are used.

[1] First Embodiment

With reference to FIG. 1 to FIG. 10, a semiconductor memory of a first embodiment will be described.

(1) Basic Example

With reference to FIG. 1 to FIG. 6F, a basic example of the semiconductor memory of the present embodiment will be described.

<Configuration>

The structure of the basic example of the semiconductor memory of the present embodiment will be described.

FIG. 1 is a cross-sectional view illustrating a configuration of the semiconductor memory of the present embodiment.

As depicted in FIG. 1, the semiconductor memory of the present embodiment includes a plurality of memory cells. A certain number of memory cells MC are provided in a memory cell string MS as a control unit (select unit).

In the present embodiment, the memory cell string MS includes a plurality of select gate transistors and a plurality of cut-off transistors XG, in addition to the memory cells MC.

In the memory cell string MS, the memory cells MC are arrayed on a semiconductor substrate 90 (semiconductor area AA) along a Y direction. The semiconductor substrate 90 is, for example, a silicon (Si) substrate.

The memory cells MC are field effect transistors each with a stacked gate structure including a charge storage layer CS. Each of the memory cells stores data of 1 bit or more based on association of data with the quantity of charge (a threshold voltage of the memory cell) in the charge storage layer CS.

The charge storage layers CS are provided on a gate insulating film 60 on the semiconductor substrate 90.

For example, a material for the gate insulating film 60 is selected from silicon oxide, silicon oxynitride, and a high-dielectric material (for example, aluminum oxide, hafnium oxide, or zirconium oxide). The gate insulating film 60 may be a mixture film or a stack film of these materials. The gate insulating film 60 has a film thickness set within a range from approximately 1 nm to approximately 10 nm. For example, the gate insulating film 60 preferably has a film thickness within a range from 3 nm to 7 nm.

The charge storage layers CS are formed using, for example, an oxide semiconductor layer 61.

A material for the oxide semiconductor layer 61 is an oxide of indium (In), gallium (Ga), zinc (Zn), or tin (Sn) or a mixture (compound) thereof. For example, the material for the oxide semiconductor layer 61 is InGnZnO. The oxide semiconductor layer 61 has a film thickness set within a range from approximately 1 nm to approximately 15 nm. For example, the oxide semiconductor layer 61 preferably has a film thickness within a range from 3 nm to 10 nm.

Control gate electrodes 80 are provided above the respective charge storage layer CS. A conductive layer 80 serving as the control gate electrode is used as word lines WL. For example, the word lines WL are referred to as control gate lines. In the memory cell string MS, the memory cells MC are connected to the different word lines WL.

An insulating layer 62 is provided between the control gate electrodes 80 and the charge storage layers CS. The insulating layer 62 electrically separates the control gate electrodes 80 from the charge storage layers CS.

The insulating layer 62 extends in a Y direction and is continuous on the oxide semiconductor layer 61.

A material for the insulating layer 62 includes at least one of the materials used for the gate insulating film 60. For example, the insulating layer 62 has a film thickness set equivalent to the film thickness of the gate insulating film 60. However, the material for the insulating layer 62 may be different from the material for the gate insulating film 60. The film thickness of the insulating layer 62 may be different from the film thickness of the gate insulating film 60.

Source/drain regions 64 of the memory cells MC are provided in the semiconductor substrate 90. The source/drain regions 64 are, for example, n-type silicon diffusion layers with a high concentration of n-type dopant such as phosphor or arsenic is added.

A semiconductor area between the two source/drain regions 64 corresponds to a channel region of the memory cells MC. The channel region of the memory cells MC is a p-type semiconductor layer. The control gate electrode 80 is disposed above the channel region. The source/drain regions 64 connect current paths of a plurality of memory cells MC together in series.

When a portion (an element) including the channel region between the source/drain regions 64 is hereinafter focused on, the memory cell MC may be referred to as a sense transistor (or a read transistor).

A plurality of cut-off transistors XG is disposed above the semiconductor substrate 90.

Each of the cut-off transistors XG is provided between two memory cells MC. Above the semiconductor substrate 90, the cut-off transistors XG and the memory cells MC are alternately arranged in the Y direction.

A gate electrode 81 of each of the cut-off transistors XG is provided on the insulating layer 62 on the oxide semiconductor layer 61. In the cut-off transistors XG, the insulating layer 62 is used as a gate insulating film.

The cut-off transistors XG use the oxide semiconductor layer 61 for channel regions. The oxide semiconductor layer 61 is a continuous film used for the charge storage layers CS of the memory cells MC and the channel regions of the transistors XG.

The gate electrode 81 of each cut-off transistor XG is provided above the corresponding source/drain region 64 of the memory cells MC. Consequently, below the gate electrodes 81 of the cut-off transistors XG, channel regions (parasitic channel regions) in the semiconductor substrate 90 for the cut-off transistors XG are not formed in the semiconductor substrate 90.

The conductive layer 81 is used as the gate electrodes of the transistors SX and also as cut-off gate lines XL. The plurality of cut-off transistors XG in the memory cell string MS is connected to the different cut-off gate lines XL.

Each of the cut-off transistors XG is an element configured to control injection of charge into the corresponding memory cell MC, emission of charge from the memory cell MC, and holding of data in the memory cell MC.

For example, the cut-off transistor XG is set to an on state at the time of a write operation.

For example, the cut-off transistor XG is set to an off state at the time of a data holding operation and a read operation.

In the present embodiment, the number of cut-off transistors XG in the memory cell string MS is the same as the number of memory cells in the memory cell string MS. For example, in the memory cell string MS, one cut-off transistor XG and one memory cell MC form a pair. FIG. 1 illustrates an example where four memory cells MC are provided. The number of memory cells in the memory cell string MS may be five or more or three or less.

The cut-off transistors XG may also be referred to as cell transistors, transfer gate transistors, or select transistors. Correspondingly, the cut-off gate lines XL may also be referred to as word lines, transfer gate lines, or select lines.

Select transistors SG1, SG2 are disposed at a first end and a second end, respectively, of the plurality of memory cells MC connected together in series. The memory cells MC and the cut-off transistors XG are arrayed between the two select transistors SG1, SG2.

The select transistors SG1, SG2 are provided on the semiconductor substrate 90. The oxide semiconductor layer 61 extending in the Y direction is provided on an area between the two select transistors SG1, SG2.

Gate electrodes 82, 83 of the select transistors SG1, SG2 are provided on the gate insulating film 60 on the semiconductor substrate 90. The gate electrodes 82, 83 of the select transistors SG1, SG2 function as select gate lines SGS, SGD for the memory cell string MS.

Source/drain regions 64, 69A, 69B of the select transistors SG1, SG2 are provided in the semiconductor substrate 90. Channel regions of the select transistors SG1, SG2 are provided in the semiconductor substrate 90.

The select transistors SG1, SG2 are used as select elements for the memory cell string MS.

The source side select transistor SG1 and select gate line SGS need not be received.

A source line SL is connected via a source line contact 89A to the source/drain region 69A of the source line-side select transistor SG1 in the memory cell string MS.

A bit line BL is connected via a bit line contact 89B to the source/drain region 69B of the bit line-side select transistor SG2 in the memory cell string MS.

A conductive layer 84 serving as the source line SL and a conductive layer 85 serving as the bit line BL are provided in an interlayer insulating film (not depicted in the drawings). For example, the conductive layers 84 and 85 are metal layers containing at least one of copper (Cu) and aluminum (Al).

In the semiconductor memory of the present embodiment, the conductive layer 86 is connected to one end of the oxide semiconductor layer 61 via a contact 89C. The conductive layer 86 is formed, for example, using the same material as that for the conductive layers 84, 85.

The conductive layer 86 is an injection line IL.

The injection line IL is an interconnect (control line) used to control injection of charge into the charge storage layer CS of the memory cell MC and emission of charge from the charge storage layer CS of the memory cell MC.

The semiconductor substrate 90 may be a semiconductor layer provided on the insulating substrate (insulating layer). The semiconductor substrate 90 may be formed of germanium (Ge), silicon germanium (SiGe), silicon carbide (SiC), a III-V semiconductor, or an oxide semiconductor. The III-V semiconductor may be gallium nitride (GaN), indium gallium nitride (InGaN), gallium arsenic (GaAs), indium gallium arsenic (InGaAs), or the like. The oxide semiconductor may be $Ga_2O_3$, InGaZnO, InGaSnO, $SnO_2$, or the like. A transition metal sulfide semiconductor such as molybdenum sulfide ($MoS_2$) or tungsten selenide ($WSe_2$) may also be used for the semiconductor substrate 90.

Figure 2:
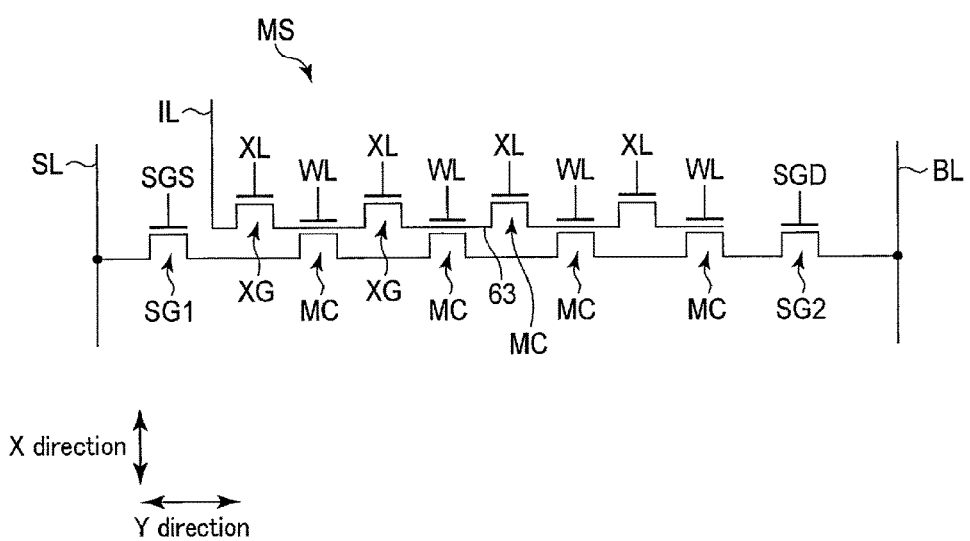
FIG. 2 is a circuit diagram illustrating a basic example of the semiconductor memory of the first embodiment.

FIG. 2 is a diagram depicting the configuration of the memory cell string MS in the semiconductor memory of the present embodiment in a circuit form.

As depicted in FIG. 2, the source line SL is connected to a terminal (source/drain) of the select transistor SG1 at the first end of the memory cell string MS. The bit line BL is connected to a terminal (source/drain) of the select transistor SG2 at the second end of the memory cell string MS.

Gates of the select transistors SG1, SG2 are connected to the select gate lines SGS, SGD, respectively.

A gate of each memory cell MC is connected to the corresponding word line WL.

A gate of each of the cut-off transistors XG is connected to the corresponding cut-off gate line XL.

The sources and drains of the memory cells MC are connected together in series between the two select transistors.

The charge storage layer CS of each memory cell MC is connected to the source and drain of the corresponding cut-off transistors XG. The charge storage layer CS is connected to the injection line IL via the sources and drains (and the channel regions) of the cut-off transistors XG. Herein, a source and a drain of the cut-off transistor indicate portions of the oxide semiconductor layer at sides of both ends of the gate of the cut-off transistor in a gate length direction.

Among the plurality of cut-off transistors XG, the cut-off transistor XG adjacent to the contact 89C of the injection line IL may have a larger gate length than the other cut-off transistors XG. This allows suppression of leakage of charge from the charge storage layer CS to the contact 89C.

The above-described memory cell string MS in the semiconductor memory of the present embodiment can be formed using a well-known film deposition technique, lithography technique, and etching technique.

<Principle and Operation>

An operating principle of the semiconductor memory of the present embodiment will be described using FIG. 3 and FIG. 4.

Figure 3:
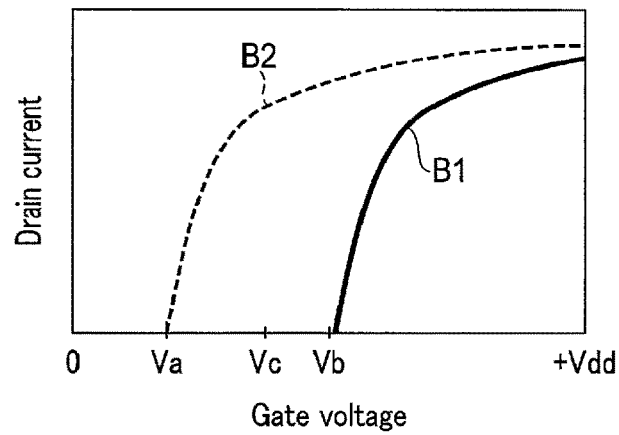
FIG. 3 and FIG. 4 are diagrams illustrating an operating principle of the semiconductor memory of the first embodiment.

FIG. 3 is a diagram illustrating characteristics of the memory cell string (memory cells) in the semiconductor memory of the present embodiment.

In FIG. 3, an axis of abscissas of the graph corresponds to a gate voltage of the memory cell (transistor), and an axis of ordinate of the graph corresponds to a drain current for the memory cell.

In FIG. 3, a characteristic line (solid line) B1 indicates a characteristic of the transistor in a state where charge (electrons) is stored in the charge storage layer of the memory cell (accumulation state). A characteristic line (dashed line) B2 indicates a characteristic of the transistor in a state where no charge is stored in the charge storage layer of the memory cell (depletion state).

The memory cell MC is a normally off transistor which is normally off in a state where no charge is stored in the charge storage layer (oxide semiconductor layer) of the memory cell (depletion state).

As indicated by the characteristic line B2, the memory cell MC having the charge storage layer CS in the depletion state is off when a control gate voltage for the memory cell is 0 V. In this case, the drain current for the memory cell MC is substantially zero.

When the control gate voltage of the memory cell MC having the charge storage layer CS in the depletion state is set to a voltage value Va or larger, the memory cell MC is set to the on state. In this case, the memory cell MC outputs a drain current with a current value corresponding to the gate voltage.

As indicated by the characteristic line B1, when charge is stored in the charge storage layer CS of the memory cell MC (accumulation state), the value of a threshold voltage is larger.

When the gate voltage is equal to the voltage value Va, the memory cell MC having the charge storage layer in the accumulation state is off. The current value of the drain current in this case is substantially zero.

When a gate voltage of a voltage value Vb (>Va) or larger is applied to the memory cell MC having the charge storage layer CS in the accumulation state, the memory cell MC is set to the on state. In this case, the memory cell MC outputs a drain current with a current value corresponding to the gate voltage.

Consequently, an output characteristic of the drain current for the memory cell MC having the charge storage layer CS in the depletion state with respect to the gate voltage is different from an output characteristic of the drain current for the memory cell MC having the charge storage layer CS in the accumulation state with respect to the gate voltage.

Association of data with the magnitude of the drain current (or the on/off state of the memory cell) allows determination of whether the memory cell MC holds "1" data or "0" data.

For example, "0" data is allocated to the memory cell with the charge storage layer CS set to the depletion state, and "1" data is allocated to the memory cell with the charge storage layer CS set to the accumulation state.

For example, the data in the memory cell MC can be determined by applying a voltage with a voltage value Vc between the voltage value Va and the voltage value Vb to the control gate electrode (word line WL) of the memory cell MC as a read voltage.

For example, in the semiconductor memory including the memory cell string in FIG. 1, the read operation is performed as described below.

In the read operation, the select transistors SG1, SG2 at the respective ends of the memory cell string are set to the on state.

A voltage (hereinafter referred to as a bit line voltage) VBL with a certain voltage value is applied to the bit line BL. For example, the potential of the source line SL is set to 0 V. A voltage lower than the voltage VBL may be applied to the source line SL.

A voltage of 0 V is applied to the gate electrode of each cut-off transistor XG. Consequently, the cut-off transistor XG is set to the off state. The plurality of charge storage layers CS in the oxide semiconductor layer 61 are kept electrically separated from one another.

A voltage higher than the read voltage is applied to the gate electrode of each unselected cell. Consequently, the unselected cell is set to the on state. Below the gate electrode of the unselected cell, a channel is formed in the semiconductor substrate 90.

The read voltage is applied to the gate electrode (word line WL) of a selected cell MC. A current flowing through the source line SL (hereinafter referred to as a source line current) is sensed by a sense amplifier circuit. Based on whether or not a current is generated in accordance with turn-on or -off of the selected cell or a comparison between a reference value and the current value of a source line current, the data in the selected cell is determined.

Consequently, the data is read from the selected cell.

A data holding state of the memory cell in the semiconductor memory of the present embodiment will be described using FIG. 4.

Figure 4:
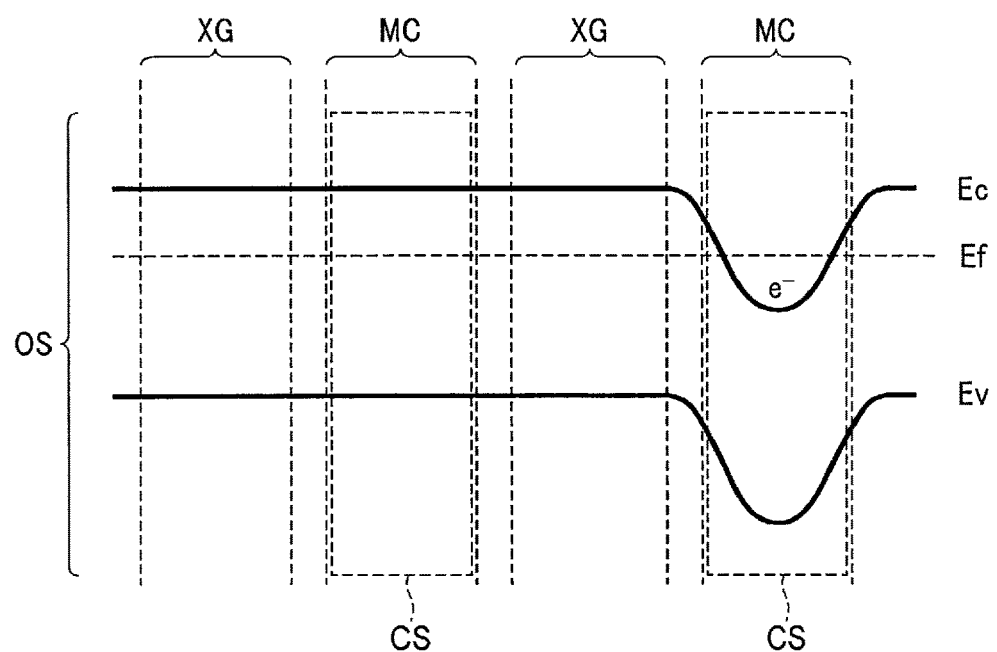

FIG. 4 is a schematic diagram illustrating a band gap state observed when the memory cell MC in the semiconductor memory of the present embodiment is in the data holding state. FIG. 4 illustrates the state of band energy between energy Ec at a conduction band lower end and energy Ev at a valence band upper end in the oxide semiconductor used for the charge storage layer CS based on a positional relation between the memory cells MC and the cut-off transistors XG.

As illustrated in FIG. 4, the memory cells MC and the cut-off transistors XG are provided on the continuous oxide semiconductor layer OS.

If electrons (e−) are accumulated in the charge storage layer CS, the energy Ec in the oxide semiconductor layer OS in the memory cell MC having the charge storage layer in the accumulation state decreases below a Fermi level Ef.

A band gap (a difference between the energy Ec and the energy Ev) in the oxide semiconductor used for the charge storage layer CS has a magnitude approximately three times as large as the magnitude of a band gap in silicon. For example, a band gap in InGaZnO is approximately 3.5 eV.

Thus, even if electrons (e−) are stored in the charge storage layers CS of the memory cells MC, leakage of electrons through an inter-band tunnel between the conduction band and the valence band in the oxide semiconductor is negligibly insignificant.

Therefore, unless the corresponding cut-off transistors XG are turned on, the electrons in the charge storage layers CS of the memory cells MC are held in the oxide semiconductor layer OS.

Thus, in the semiconductor memory of the present embodiment, the memory cells MC can hold data substantially in a nonvolatile manner even if the charge storage layers CS of the memory cells MC are not floating gate electrodes isolated from the other members.

A write operation on the semiconductor memory of the present embodiment will be described using FIG. 5A to FIG. 5F. FIG. 5A to FIG. 5F are schematic diagrams illustrating a write operation on the memory cell string (memory cell) in the semiconductor memory of the present embodiment.

As depicted in FIG. 5A to FIG. 5F, the write operation involves execution of an operation for accumulating or emitting charge in or from the charge storage layers CS of the memory cells MC.

In the semiconductor memory of the present embodiment, injection or emission of charge is executed between the injection line IL and the charge storage layer CS via an accumulation layer (channel) formed in the oxide semiconductor layer 61 of the cut-off transistors XG in the on state.

In the present embodiment, supply or emission of charge to or from the charge storage layers CS of the memory cells MC is executed in a direction parallel to a layer surface of the charge storage layer CS (a film surface of an oxide semiconductor film 63). In the present embodiment, the layer surface of the charge storage layer CS is a surface substantially parallel to an X-Y plane (a front surface of the substrate 90).

As depicted in FIG. 5A, when data is written to the memory cells MC in the memory cell string MS, a voltage with a voltage value Von is applied to the control gate electrodes (word lines) 80 of the memory cells MC and the gate electrodes (cut-off gate lines) 81 of the cut-off transistors XG.

For example, 0 V is applied to the injection line IL.

In the semiconductor memory of the present embodiment, during the write operation, the select transistors SG1, SG2 in the memory cell string MS are set to the off state. For example, 0 V is applied to the bit line BL and the source line SL.

The voltage value Von is an on voltage for the cut-off transistors XG. The voltage value Von allows a channel (accumulation layer) to be formed in the oxide semiconductor layer 61. Below the gate electrodes 80, 81, channels are formed in the oxide semiconductor layer 61.

This allows electrons to be induced throughout the oxide semiconductor layer 61.

As described above, at the start of the write operation on the semiconductor memory of the present embodiment, the oxide semiconductor layer 61 is electrically initialized (an initialization operation). The initialization operation may be used as an erasure operation for the memory.

For example, in an example of the write operation illustrated in FIG. 5A to FIG. 5F, data write starts with a memory cell MC1 included in a plurality of memory cells MC1, MC2, MC3, MC4 in the memory cell string MS and positioned opposite to the injection line IL.

As depicted in FIG. 5B, a voltage allowing data write to be controlled (referred to as a write voltage) is applied to a control gate electrode WL1 of the memory cell MC1.

During write of data to the memory cell MC1, the on voltage Von is applied to the gate electrodes of the other memory cells MC2, MC3, MC4 and the cut-off gate transistors XG. Consequently, the charge storage layer CS of the memory cell MC1 is electrically connected to the injection line IL.

For example, the write voltage has a voltage value corresponding to data to be written.

When the charge storage layer CS is set to the depletion state, a write voltage with a voltage value Voff is applied to the control gate electrode of the memory cell MC1 in order to emit electrons in the charge storage layer CS. For example, the voltage value Voff is 0 V. When a voltage of 0 V is applied to the control gate electrode of the memory cell MC1, the electrons in the charge storage layer CS is eliminated.

Consequently, the charge storage layer CS of the memory cell MC1 is set to a depletion state 999.

As depicted in FIG. 5C, with the write voltage applied to the memory cell MC1, an off voltage (voltage value Voff) for the cut-off transistor XG1 adjacent to the memory cell MC1 is applied to a gate electrode XL1 of the cut-off transistor XG1. The cut-off transistor XG1 is set to the off state.

With the charge storage layer CS of the memory cell MC1 set to the depletion state 999, the cut-off transistor XG1 in the off state electrically separates the memory cell MC1 from the other memory cells MC2 to MC4 and the injection line IL.

Subsequently, the control gate electrode WL1 of the memory cell MC1 is set to an electrically floating state.

As depicted in FIG. 5D, data write is executed on the memory cell MC2.

As is the case with the write of data to the memory cell MC1, the voltage value of a write voltage applied to a control gate electrode (word line) WL2 is controlled according to data to be written to the memory cell MC2.

When electrons are accumulated in the charge storage layer CS of the memory cell MC2, a write voltage with the voltage value Von (>Voff) is applied to the control gate electrode WL2 of the memory cell MC2. The memory cell MC2 maintains a state where electrons are induced in the charge storage layer CS.

With the write voltage with the voltage value Von applied to the memory cell MC2, the off voltage Voff is applied to a gate electrode XL2 of a cut-off transistor XG2.

Consequently, the memory cell MC2 is electrically separated from the injection line IL and the other memory cells MC3, MC4. The charge storage layer CS of the memory cell MC2 is set to an accumulation state 995.

As depicted in FIG. 5E, data write is executed on the memory cell MC3.

For example, when the charge storage layer CS of the memory cell MC3 is set to the depletion state, the write voltage with the voltage value Voff is applied to a control gate electrode WL3 of the memory cell MC3.

With the write voltage applied, the off voltage Voff is applied to a gate electrode XL3 of a cut-off transistor XG3.

Consequently, the charge storage layer CS of the memory cell MC3 is set to a depletion state 999.

Figure 5F:
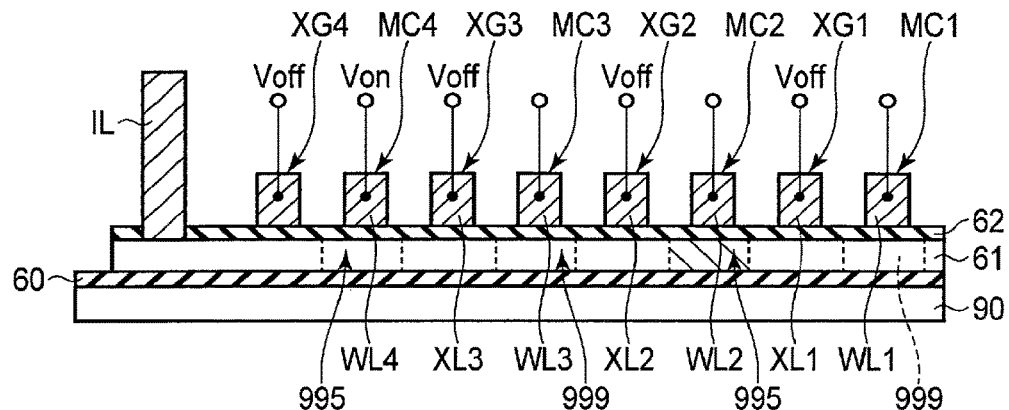

As depicted in FIG. 5F, data write is executed on the memory cell MC4.

For example, when the charge storage layer CS of the memory cell MC4 is set to the accumulation state, the write voltage with the voltage value Von is applied to a control gate electrode WL4 of the memory cell MC4.

With the write voltage applied, the off voltage Voff is applied to a gate electrode XL4 of a cut-off transistor XG4.

Consequently, the charge storage layer CS of the memory cell MC4 is set to the accumulation state 995.

The injection line IL is set to a certain potential (for example, 0 V) at a timing when execution of data write on one or more memory cells MC is completed.

As depicted in FIG. 5A to FIG. 5F, predetermined data can be written to each of the plurality of memory cells MC sharing the single oxide semiconductor layer 61.

A write operation in a mode different from the mode in FIG. 5A to FIG. 5F in the semiconductor memory of the present embodiment will be described using FIG. 6A to FIG. 6F.

In FIG. 6A to FIG. 6F, in the semiconductor memory of the present embodiment, the initial state of the oxide semiconductor layer 61 during the write operation is set to the depletion state, and then, the charge storage layer CS of each of the memory cells MC1 to MC4 is set to the depletion state or the accumulation state.

Figure 6A:
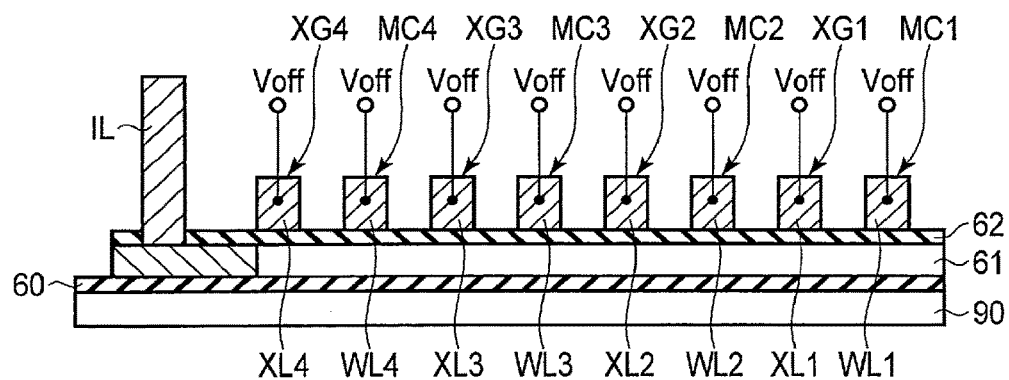

As depicted in FIG. 6A, when data is written to the memory cells MC, the voltage value (off voltage) Voff is applied to the control gate electrode (word line) WL of each memory cell MC and to the gate electrode (cut-off gate line) XL of each cut-off transistor XG. For example, a positive voltage is applied to the injection line IL. The electrons in the oxide semiconductor layer 61 are emitted to the injection line IL. Consequently, the oxide semiconductor layer 61 as a whole is depleted.

If the charge storage layer of each memory cell MC is set to the depletion state/accumulation state after the oxide semiconductor layer 61 is set to the depletion state, data write is executed by transferring charge from the injection line-side memory cell MC4 toward the memory cell MC1.

Figure 6B:
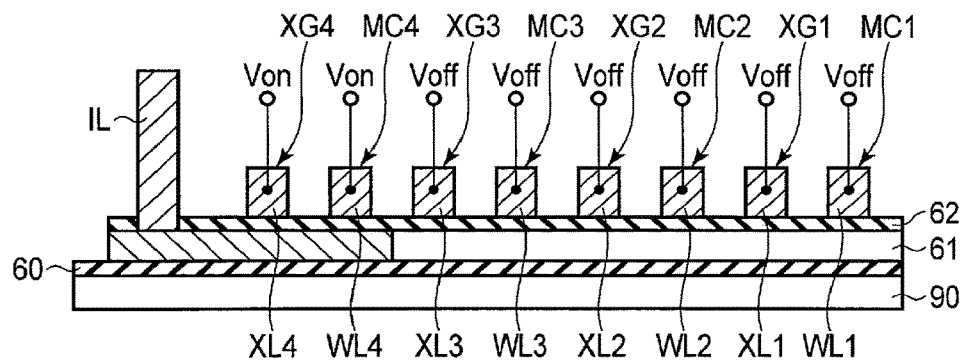

As depicted in FIG. 6B, the on voltage Von is applied to the gate electrode XL4 of the cut-off transistor XG4. The off voltage Voff is applied to each of the gate electrodes XL1, XL2, XL3 of the other cut-off transistors XG1, XG2, XG3.

The charge storage layer CS of the memory cell MC4 is electrically connected to the injection line IL via the transistor XG4 in the on state. The charge storage layers CS of the other memory cells MC1, MC2, MC3 are electrically separated from the injection line IL by the cut-off transistors XG1, XG2, XG3 in the off state.

With the cut-off transistor XG4 set to the on state, the write voltage is applied to the control gate electrode WL4 of the memory cell MC4.

For example, when the charge storage layer CS of the memory cell MC4 is set to the accumulation state, the positive voltage (for example, the voltage value Von) is applied to the control gate electrode WL4.

Consequently, electrons are induced below the gate electrode WL4 of the memory cell MC4.

Figure 6C:
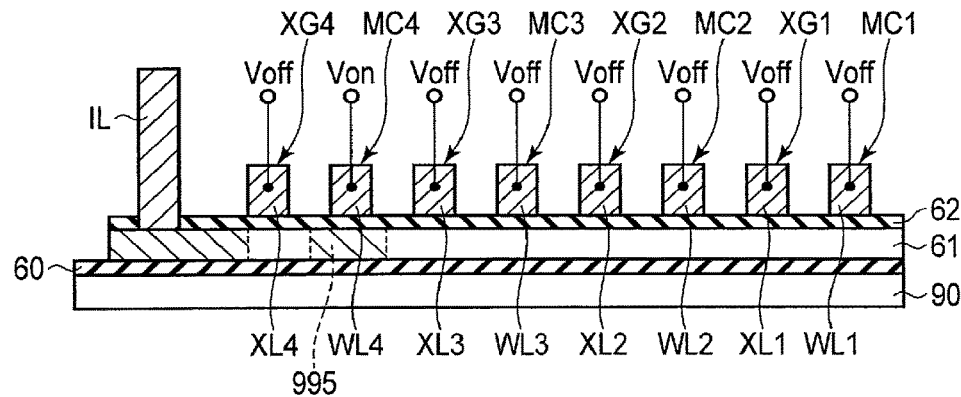

As depicted in FIG. 6C, with electrons induced in the charge storage layer CS of the memory cell MC4, the off voltage Voff is applied to the gate electrode XL4. Thus, the cut-off transistor XG4 is set to the off state. The charge storage layer CS of the memory cell MC4 is set to the accumulation state 995.

Figure 6D:
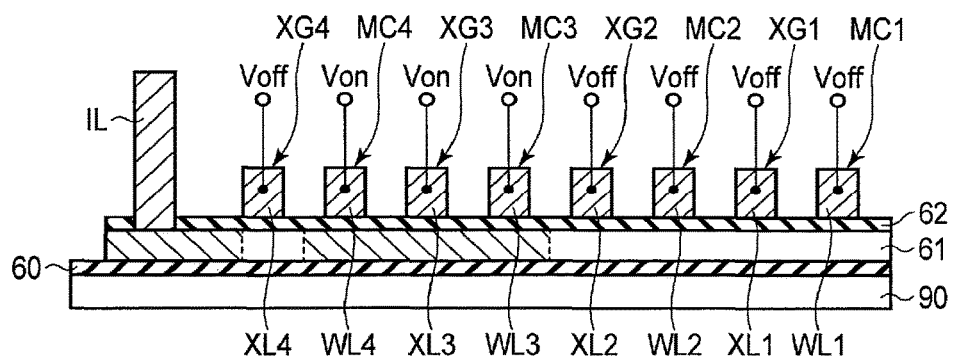

As depicted in FIG. 6D, after an electrical state (the accumulation state or the depletion state) of the charge storage layer CS of the memory cell MC4 is set, the electrical state of the charge storage layer is set for the memory cell MC3 positioned opposite to the injection line IL with respect to the memory cell MC4.

The cut-off transistor XG3 between the memory cell MC4 and the memory cell MC3 is set to the on state. At this time, the cut-off transistor XG4 between the injection line IL and the memory cell MC4 is set to the off state. The cut-off transistors XG1, XG2 are set to the off state.

The gate voltage is applied to the control gate electrode WL3 of the memory cell MC3.

When the charge storage layer CS of the memory cell MC3 is set to the accumulation state, the voltage value Von is applied to the control gate electrode WL3.

The charge storage layer CS of the memory cell MC3 is electrically connected to the charge storage layer CS of the memory cell MC4 via the transistor XG3 in the on state.

Figure 6E:
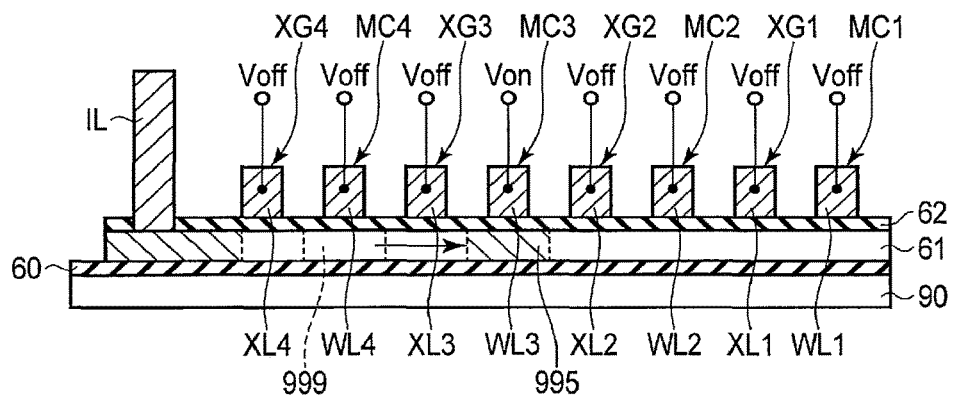

As depicted in FIG. 6E, the off voltage Voff is applied to the gate electrode WL4 of the memory cell. MC4. Subsequently, with the voltage value Von applied to the control gate electrode WL3 of the memory cell MC3, the off voltage Voff is applied to the gate electrode XL3 of the cut-off transistor XG3.

Thus, the electrons in the charge storage layer CS of the memory cell MC4 are transferred into the charge storage layer CS of the memory cell MC3.

The charge storage layer CS of the memory cell MC3 is set to the accumulation state. The charge storage layer CS of the memory cell MC4 is set to the depletion state.

As depicted in FIG. 6F, the memory cell MC4 is set to the accumulation state by an operation similar to the operation illustrated in FIG. 6B and FIG. 6C.

For example, when the charge storage layer CS of the memory cell MC2 is set to the accumulation state, the cut-off transistor XG2 is set to the on state by an operation similar to the operation illustrated in FIG. 6B and FIG. 6C, and a voltage with the voltage value Von is applied to the gate electrode WL2 of the memory cell MC2. Consequently, electrons are transferred from the charge storage layer CS of the memory cell MC3 to the charge storage layer CS of the memory cell MC2.

Operations similar to the operations in FIG. 6A to FIG. 6F set the state of the charge storage layer CS of the memory cell MC1 to the accumulation state or the depletion state according to data to be stored.

After the electrical state of the charge storage layer CS of each memory cell MC is set, the word line WL is set to the electrically floating state.

As described above, transfer of the charge in the oxide semiconductor layer 61 allows predetermined data to be written to each memory cell MC.

Turn on/off of the transistor (control of the accumulation state/depletion state in the channel region) allows data to be controllably written to the memory cell MC by controlling the potential of the injection line IL in addition to controlling the potential of the word line WL.

For example, in the semiconductor memory of the present embodiment, predetermined data can be written to the memory cell MC by varying the potential of the injection line IL according to the data to be written, with the potential of the word line WL fixed to a certain value.

(2) Specific Example

With reference to FIG. 7 to FIG. 10, a specific example of the semiconductor memory of the present embodiment will be described.

<Circuit Configuration>

FIG. 7 is a block diagram illustrating a configuration example of the semiconductor memory of the present embodiment.

As depicted in FIG. 7, a semiconductor memory 1 of the present embodiment is electrically connected to a host device 9. The host device 9 is, for example, a memory controller or a processor (for example, a CPU).

The semiconductor memory 1 operates in accordance with requests or commands from the host device 9. The host device 9 is provided outside the semiconductor memory 1. The semiconductor memory 1 may be provided inside the host device 9.

To operate the semiconductor memory 1, the host device 9 transmits commands, addresses, and various control signals to the semiconductor memory 1.

During the write operation on the semiconductor memory 1, the host device 9 transmits the data to be written (data to be stored) to the semiconductor memory 1 along with the write command.

During the read operation on the semiconductor memory 1, the host device 9 receives data read from the semiconductor memory 1 as a response to the read command.

The semiconductor memory 1 of the present embodiment is, for example, a sequential access memory.

The semiconductor memory 1 of the present embodiment includes a memory cell array 10, a row control circuit 12, a column control circuit 13, a write/read circuit 14, an input/output circuit 15, a voltage generation circuit 16, and a sequencer 17.

The memory cell array 10 includes a plurality of memory cell strings MS.

The memory cell array 10 includes a plurality of bit lines BL, a plurality of source lines SL, a plurality of word lines WL, and a plurality of cut-off gate lines XL. These interconnects connect to the memory cell strings MS.

The decoder 11 decodes addresses supplied by the host device 9. The decoder 11 decodes row addresses from the memory cell array 10 and column addresses from the memory cell array 10.

The row control circuit 12 controls the rows in the memory cell array 10 based on the result of decoding of an address by the decoder 11. The row control circuit 12 allows selection of the memory cell string MS corresponding to the decoded row address with respect to the X direction in the memory cell array 10. The row control circuit 12 controls the potential of each of the word lines WL, the potentials of the select gate lines SGS, SGD, and the potential of each of the cut-off gate lines XL For example, the row control circuit 12 includes a word line driver (word line select circuit) and a cut-off gate line driver.

The column control circuit 13 controls the columns in the memory cell array 10 based on the result of decoding of an address by the decoder 11. The column control circuit 13 allows selection of the memory cell string MS corresponding to the decoded column address with respect to the Y direction in the memory cell array 10. The column control circuit 13 controls the potential of each of the bit lines BL. For example, the column control circuit 13 includes a sense amplifier circuit and a bit line driver (bit line select circuit).

The column control circuit 13 includes, for example, a circuit (hereinafter referred to as an injection line control circuit) 130 configured to control the potential of the injection line IL. The injection line control circuit 130 allows controllable activation/inactivation of a plurality of injection lines IL. The injection line control circuit 130 enables a voltage corresponding to the data to be written to be supplied to the injection line IL during the write operation.

The data holding circuit 14 temporarily holds data from the host device 9 or data from the memory cell array 10 during write or read of data to or from the memory cell string MS. The data holding circuit 14 can hold at least one page of data. A page is a data access unit for the memory cell array 10. The data holding circuit 14 is also referred to as a page buffer circuit.

The input/output circuit 15 functions as an internal interface for the semiconductor memory 1. The input/output circuit 15 receives data, commands, control signals, and addresses from the host device 9. The input/output circuit 15 sends data from the memory cell array 10 to the host device 9. For example, the input/output circuit 15 includes a latch circuit which can temporarily hold data, a command, and an address.

The voltage generation circuit 16 generates various voltages used for the write operation and the read operation. The voltage generation circuit 16 supplies the generated voltages to the row control circuit 12 and the column control circuit 13. For example, the voltage generation circuit 16 generates a write voltage during the write operation. The voltage generation circuit 16 generates a read voltage during the read operation. The voltage generation circuit 16 generates voltages to be applied to the cut-off gate lines XL, voltages to be applied to the unselected word lines WL, and voltages to be applied to the select gate lines SGS, SGD.

The sequencer 17 controls operations of the circuits 10 to 16 in the semiconductor memory 1 such that the circuits perform operations requested/commanded by the host device 9.

A circuit configured to control the injection line IL may be provided separately from the row control circuit 12 and the column control circuit 13.

The semiconductor memory 1 of the present embodiment is a sequential access memory in which the oxide semiconductor is used for the charge storage layer (memory film).

Figure 8:
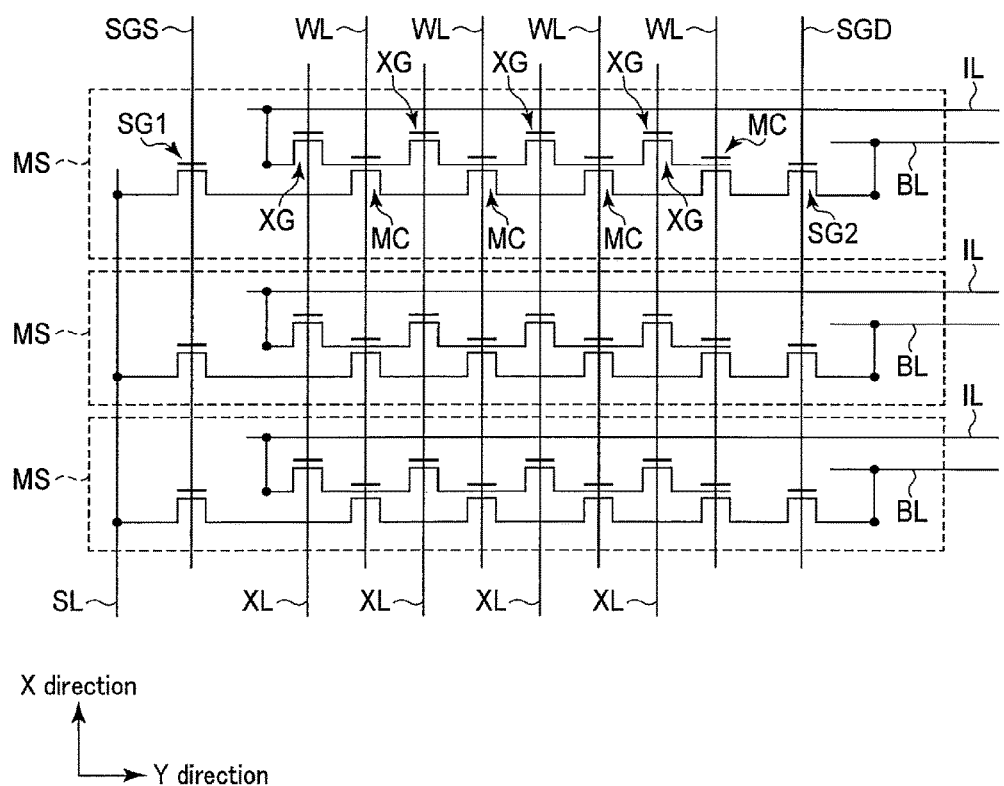
FIG. 8 is a circuit diagram illustrating the specific example of the semiconductor memory of the first embodiment.

FIG. 8 is an equivalent circuit diagram of a sequential access memory cell array of the present embodiment.

FIG. 8 depicts three of m memory cell strings in the memory cell array for simplification of illustration, where m denotes a natural number of two or more.

As depicted in FIG. 8, in the memory cell array 10, a plurality of (in this case, three) memory cell strings is arrayed along the X direction.

One source line SL is provided in the memory cell array 10 so as to be shared by the plurality of memory cell strings MS. The source line SL connects to a first end of each of a plurality of (in this case, three) memory cell strings MS arrayed in the x direction.

A plurality of (in this case, three) bit lines BL is provided in the memory cell array 10 so as to correspond to the number of memory cell strings MS. The bit lines BL connect to second ends of the corresponding memory cell strings MS.

A plurality of (in this case, four) cut-off gate lines XL is provided in the memory cell array 10 so as to correspond to the number of cut-off transistors XG in the memory cell string MS. Each of the cut-off gate lines xL is connected to gates of the plurality of cut-off transistors XG arrayed in the X direction.

A plurality of (in this case, four) word lines WL is provided in the memory cell array 10 so as to correspond to the number of memory cells MC in the memory cell string MS. Each of the word lines WL is connected to gates of the plurality of memory cells MC arrayed in the Y direction.

As described above, the charge storage layers (oxide semiconductor layers) CS of the memory cells MC are connected to the injection line IL via the channel regions of the transistors XG in the oxide semiconductor layer 61.

One injection line IL is connected to each of the memory cell strings MS. For example, the potentials of the injection lines IL are independently controlled, for example, by the column control circuit 13. Control of the potentials of the injection lines IL is performed by the row control circuit 12.

Structure Example

A structure example of the memory cell array in the semiconductor memory (sequential access memory) of the present embodiment will be described using FIG. 9 and FIG. 10.

Figure 9:
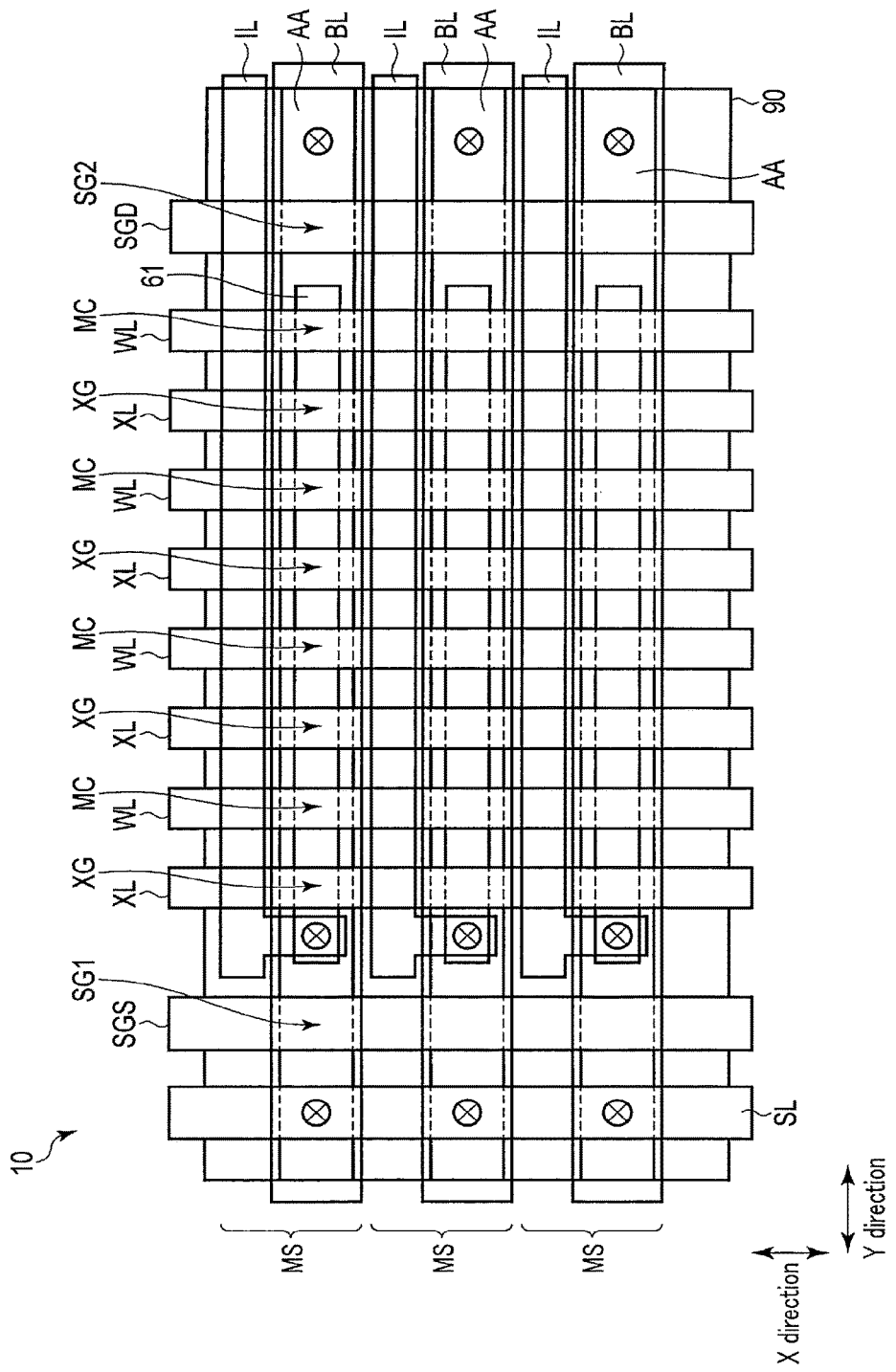
FIG. 9 is a top view illustrating the specific example of the semiconductor memory of the first embodiment.

FIG. 9 is a top view depicting the structure example of the memory cell array in the semiconductor memory of the present embodiment.

FIG. 10 is a cross-sectional view depicting the structure example of the memory cell array in the semiconductor memory of the present embodiment. FIG. 10 depicts the sectional structure of the memory cell array along the X direction.

The sectional structure, along the Y direction, of the memory cell array in FIG. 9 and FIG. 10 is substantially the same as the sectional structure in the example illustrated in FIG. 1. FIG. 1 is hereinafter used to describe the sectional structure of the memory cell array along the Y direction.

As depicted in FIG. 9 and FIG. 10, the memory cell string MS is provided in a semiconductor area AA extending in the Y direction.

Semiconductor areas AA adjacent to each other in the X direction are electrically separated from each other by element isolation insulating layers 99 in the semiconductor substrate 90. For example, the element isolation insulating layers 99 extend in the Y direction.

The select gate lines SGS, SGD extend in the X direction. Each of the select gate lines SGS, SGD straddles the plurality of semiconductor areas AA via the insulating layer 60.

The conductive layers 80 serving as the word lines WL extend in the X direction. Each of the word lines WL straddles a plurality of the oxide semiconductor layers 61 arrayed in the X direction.

In the example in FIG. 10, side surfaces of the oxide semiconductor layers 61 are covered with the conductive layer 80 via an insulating layer 62. However, the side surfaces of the oxide semiconductor layers may be covered with the element isolation insulating layers 99 rather than with the conductive layer 80.

The conductive layers serving as the cut-off gate lines XL extend in the X direction parallel to the word lines WL. The cut-off gate lines XL straddle the plurality of oxide semiconductor layers 61 arrayed in the X direction.

For the structure with the oxide semiconductor layers 61 and the conductive layer serving as the cut-off gate lines XL, the cut-off gate lines XL have substantially the same structure as that of the word lines WL.

The injection lines IL and the bit lines BL extend in the Y direction. The conductive layers 85 serving as the injection lines IL and the conductive layers 83 serving as the bit lines BL are provided on an insulating layer (interlayer insulating film) 95 on the conductive layers 80. The conductive layers 83, 85 are positioned at the same interconnect level. In the present embodiment, the interconnect level indicates a position (height) based on the front surface of the semiconductor substrate.

For example, the bit lines BL are disposed above the semiconductor areas AA. The injection lines IL are disposed above the element isolation insulating layers 99. The injection lines IL has a portion which is drawn out from a position above the corresponding oxide semiconductor layer 61 to a position above the corresponding element isolation insulating layer 99. A layout relation between the bit lines BL and the injection lines IL may be such that the layout of the bit lines BL is opposite to the layout of the injection lines IL.

For example, the source lines SL are provided at an interconnect level below the interconnect level of the bit lines BL. For example, the source lines SL extend in the X direction.

Operation Example

Now, an operation of the semiconductor memory (for example, a sequential access memory) of the present embodiment will be described.

Memory cell strings and memory cells selected as operational targets are hereinafter referred to as selected strings and selected cells, respectively. In contrast, memory cell strings and memory cells not selected as operational targets are hereinafter referred to as unselected strings and unselected cells, respectively.

(A) Write Operation

During a write operation on the sequential access memory of the present embodiment, the host device 9 transfers the write command, various control signals, an address indicative of a data write target, and data to be written to the memory cells (hereinafter referred to as write data) to the sequential access memory 1. For example, one page of data is supplied to the memory 1.

The sequential access memory 1 writes the data to the memory cell strings (memory cells) indicated by the address based on the command and the control signals.

The sequencer 17 controls the operation of each of the circuits in the sequential access memory 1 based on the command and the control signals. The row control circuit 12 and the column control circuit 13 execute activation and inactivation of the interconnects in the memory cell array 10 based on the result of decoding of the address by the decoder 11. One page of data from the input/output circuit 15 is supplied to a page buffer circuit 14.

The injection line control circuit 130 in the column control circuit 13 determines voltages applied to the interconnects (for example, the injection lines IL) based on the write data. The voltages applied to the injection lines IL may be determined by the row control circuit 12.

Various voltages for the write operation are applied to the interconnects in the memory cell array 10.

For example, during the write operation, the select transistors SG1, SG2 are set to the off state, and the bit lines BL and the source lines SL are electrically separated from the memory cell strings MS.

The sequencer 17 allows the circuits in the sequential access memory 1 of the present embodiment to perform the respective operations so as to allow execution of the write operation illustrated in FIG. 5A to FIG. 5F (or the write operation illustrated in FIG. 6A to FIG. 6F).

For example, data write is simultaneously executed on a plurality of the memory cells MC connected to a common selected word line. The potentials of the injection lines IL are controlled in accordance with the respective memory cell strings MS to allow predetermined data to be written to the respective memory cells MC connected to the common selected word line.

The potentials of the injection lines IL may be controlled so as to set at least one of the plurality of selected cells to be inhibited from being subjected to data write.

Consequently, the electrical state (the accumulation state or the depletion state) of the charge storage layer CS of each memory cell MC is controlled.

As described above, in the sequential access memory 1 of the present embodiment, the write operation on the selected cells is completed.

For example, the sequencer 17 can notify the host device 9 of completion of the write operation.

(B) Data Holding Operation

In the sequential access memory of the present embodiment, after the write operation is completed, the selected strings perform a data holding operation.

In the data holding operation, the potential of each cut-off gate line XL is set to 0 V. The cut-off transistor XG is set to the off state. Each of the word lines WL is set to the electrically floating state.

This prevents diffusion (leakage) of electrons in the charge storage layer CS of each memory cell MC and entry of electrons into the charge storage layer CS.

As described above, in the sequential access memory of the present embodiment, the data holding state of each memory cell MC is continued.

(C) Read Operation.

During a read operation on the sequential access memory of the present embodiment, the host device 9 transfers the read command, various control signals, and an address indicative of a data read target to the sequential access memory 1.

The sequential access memory 1 reads data from a page indicated by the address based on the command and the control signals.

The sequencer 17 controls the operation of each of the circuits in the sequential access memory 1 based on the command and the control signals. The row control circuit 12 and the column control circuit 13 execute activation and inactivation of the interconnects in the memory cell array 10 based on the result of decoding of the address. The sense amplifier circuit, the driver circuit, and the like are activated.

Consequently, various voltages for the read operation are applied to the interconnects in the memory cell array 10.

For example, data read is concurrently executed on all of the plurality of memory cells connected to the selected word line (the plurality of memory cells belonging to the selected page).

The row control circuit 12 applies the on voltage for the select transistors SG1, SG2 to the select gate lines SGS, SGD. Consequently, the select transistors SG1, SG2 are turned on. The row control circuit 12 applies the off voltage for the cut-off transistors (for example, 0 V) to the cut-off gate lines XL. A non-select voltage is applied to the unselected word lines WL.

The column control circuit 13 charges a plurality of the bit lines BL. A bit line voltage is applied to each of the bit lines BL. The injection line control circuit 130 in the column control circuit 13 applies 0 V to a plurality of the injection lines IL.

As described above using FIG. 3, the read voltage is applied to the selected word line WL. The sense amplifier circuit in the column control circuit 13 senses a fluctuation in the potential of each bit line BL resulting from turn on/off of the memory cells MC or presence/absence of generation of a current between the bit line BL and the source line SL.

Based on the sensing result, the data in the memory cells MC connected to the selected word line WL is determined.

The data in each memory cell MC is output to the page buffer circuit 14. One page of data in the page buffer circuit 14 is transferred to the host device 9 via the input/output circuit 15.

As described above, in the sequential access memory 1 of the present embodiment, the read operation on the selected cells is completed.

(3) Modification

In a semiconductor memory including memory cells each having a charge storage layer formed of an oxide semiconductor layer, data of 2 bits or more can be stored in each memory cell MC by controlling the voltage applied to the corresponding word line WL or the potential of the corresponding injection line IL during the write operation.

If memory cell MC stores 2 bit data ("00", "01", "10", and "11"), the 2 bit data is associated with four states (charge storage states) according to the quantity of charge in the charge storage layer CS.

Four voltage values are used for the write voltage applied to the word line WL (or the injection line IL) to write 2 bit data into the memory cell MC. The memory cell MC can be set to one of the four states according to the magnitude of the write voltage.

The quantity of electrons induced in the charge storage layer CS varies according to the magnitude of the write voltage. When the write voltage is 0 V, the quantity of electrons in the charge storage layer CS is set to a value (range) corresponding to the storage state of "11" data.

If the magnitude of a write voltage VWR is equal to a voltage value V1, the quantity of electrons in the charge storage layer CS is set to a value corresponding to the storage state of "00" data.

When the voltage value of the write voltage is reduced below the voltage value V1 allowing "00" data to be written, the quantity of electrons in the charge storage layer CS can be set to a value larger than the value corresponding to "11" data and smaller than the value corresponding to "00" data.

For example, when the magnitude of the write voltage is set to one-third of the voltage value V1 allowing "00" data to be written, the quantity of electrons in the charge storage layer CS is set to a value corresponding to the storage state of "10" data.

When the magnitude of the write voltage is set to two-thirds of the voltage value V1 allowing "00" data to be written, the quantity of electrons in the charge storage layer CS is set to a value corresponding to the storage state of "01" data.

For such data write, the data in each memory cell MC is determined depending on whether or not the memory cell MC is turned on in response to application of the read voltage during the read operation or based on the result of comparison of the current value of the read current.

Data of 3 bits or more can be stored in the memory cell MC by controlling the potential of the corresponding word line WL (and the corresponding injection line IL). For example, if 3 bit data is written to the memory cell MC, eight voltage values are used for the write voltage.

As described above, data of 2 bits or more can be stored in the memory cell MC by subdividing the voltage value of the write voltage.

(4) Conclusion

The semiconductor memory of the first embodiment is a memory (for example, a sequential access memory) including memory cells each with an oxide semiconductor layer used for a charge storage layer.

For example, in a conventional NAND flash memory serving as a sequential access memory, an erase operation is performed in units of blocks each of which is a set of a plurality of pages. Thus, in the flash memory, the data in the block is temporarily saved to another memory before an erase operation on the block and write of the updated data are performed. Consequently, in the flash memory, the write operation is performed very slowly.

Furthermore, in the flash memory, write and erasure of data are executed by injecting and emitting electrons into and from the charge storage layer using the tunneling effect, and thus, a relatively high voltage is applied to a gate electrode and to a gate insulating film. Thus, in the flash memory, stress attributed to the voltage causes the gate insulating film of each memory cell to be gradually degraded. As a result, in the flash memory, a data retention characteristic of the memory cells may be degraded to cause a data loss.

In the semiconductor memory of the present embodiment, the oxide semiconductor layer of one memory cell string can be charged in several nanoseconds to several tens of nanoseconds. Thus, the semiconductor memory of the present embodiment allows the erase operation and the write operation to be performed more quickly than the NAND flash memory.

Therefore, data can be written relatively quickly to the semiconductor memory of the present embodiment.

The semiconductor memory of the present embodiment allows application, to the control gate electrode (word line), of the voltage which enables controllable accumulation and depletion of charge in the charge storage layer during the write operation.

In the semiconductor memory of the present embodiment, charge is stored in the charge storage layer by a migration of charge along the layer of the oxide semiconductor layer.

Consequently, the semiconductor memory of the present embodiment allows electrons to be stored in and emitted from the charge storage layer CS in the oxide semiconductor layer 61 without using a high voltage which is necessary to utilize an electron tunneling phenomenon.

Therefore, in the semiconductor memory of the present embodiment, the memory cells are substantially inhibited from being degraded due to the number of write operations/erase operations. As a result, the semiconductor memory of the present embodiment can be used without being limited in terms of the number of rewrites. Therefore, the semiconductor memory of the present embodiment can maintain data reliability.

The semiconductor memory of the present embodiment stores data by accumulating charge in the oxide semiconductor layer, which has a large band gap. Consequently, the semiconductor memory of the present embodiment allows suppression of leakage of electrons and improvement of the data retention characteristics of the memory cells, using low power consumption.

As described above, the semiconductor memory of the present embodiment can provide a high-performance semiconductor memory.

[2] Second Embodiment

With reference to FIG. 11 to FIG. 14, a semiconductor memory of a second embodiment will be described.

FIG. 11 is a cross-sectional view illustrating a structure example of the semiconductor memory of the present embodiment.

As depicted in FIG. 11, injection lines ILA, ILB may be provided at the respective ends of the oxide semiconductor layer 61. The potentials of the two injection lines ILA, ILB are independently controlled.

A conductive layer 86A serving as the injection line ILA is connected to a first end of the oxide semiconductor layer 61 via a contact 89CA. A conductive layer 86B serving as the injection line ILB is connected to a second end of the oxide semiconductor layer 61 via a contact 89CB.

The memory cells MC and the cut-off transistors XG are alternately arrayed between the two contacts 89CA, 89CB.

If the two injection lines ILA, ILB are connected to the one oxide semiconductor layer 61 as in the semiconductor memory of the present embodiment, the number of cut-off transistors XG is larger than the number of memory cells MC by one.

Figure 12:
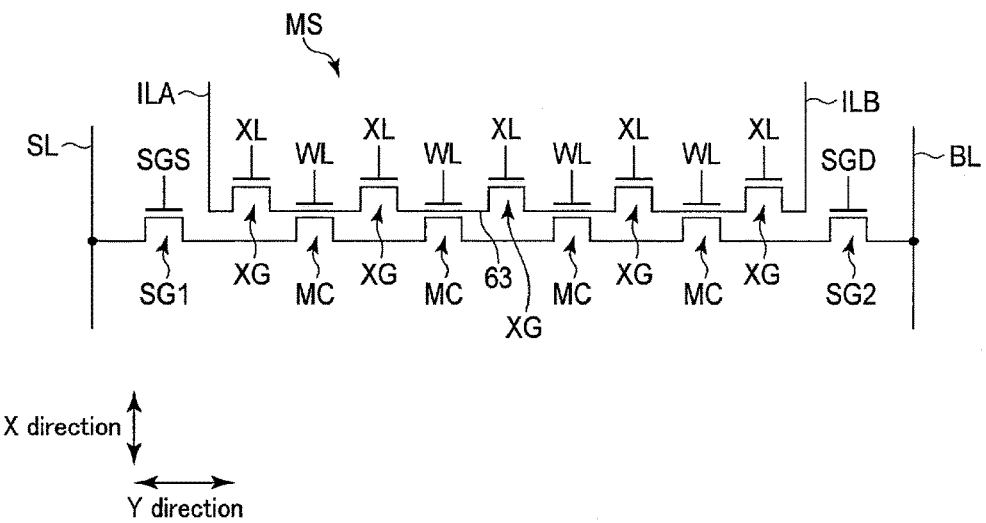
FIG. 12 is a circuit diagram illustrating the semiconductor memory of the second embodiment.

FIG. 12 is an equivalent circuit diagram of the memory cell string MS in FIG. 11.

As depicted in FIG. 12, the first injection line ILA is connected to a first end of a set of the plurality of cut-off transistors XG connected together in series via the charge storage layers CS. The second injection line ILB is connected to a second end of the set of the plurality of cut-off transistors XG connected together in series via the charge storage layers CS.

The current path in each of the cut-off transistors XG is connected between the charge storage layers CS of the memory cells MC adjacent to each other in the Y direction.

The electric connection between each of the injection lines ILA, ILB and the charge storage layers of the memory cells MC is controlled by the cut-off transistors XG.

An example of a write operation on a semiconductor memory (for example, a sequential access memory) in FIG. 11 and FIG. 12 will be described using FIG. 13A and FIG. 13B.

Like the write operation described with reference to FIG. 5A to FIG. 5F, the write operation in FIG. 13A to FIG. 13E illustrates an operation example where the initial state of the oxide semiconductor layer 61 in the semiconductor memory in FIG. 11 and FIG. 12 is set to the accumulation state.

Figure 13A:
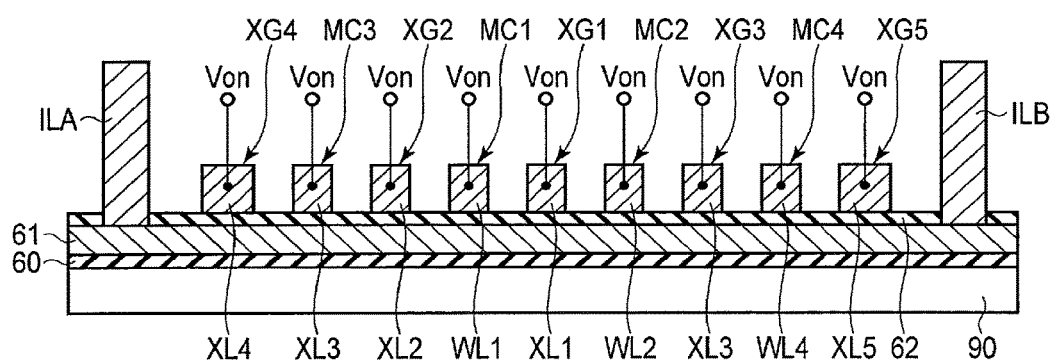

As depicted in FIG. 13A, the on voltage Von is applied to the gate electrodes of the cut-off transistors XG and the memory cells MC. For example, a positive voltage is applied to the injection lines ILA, ILB.

Consequently, electrons are induced in the oxide semiconductor layer 61, which is thus set to the accumulation state.

Figure 13B:
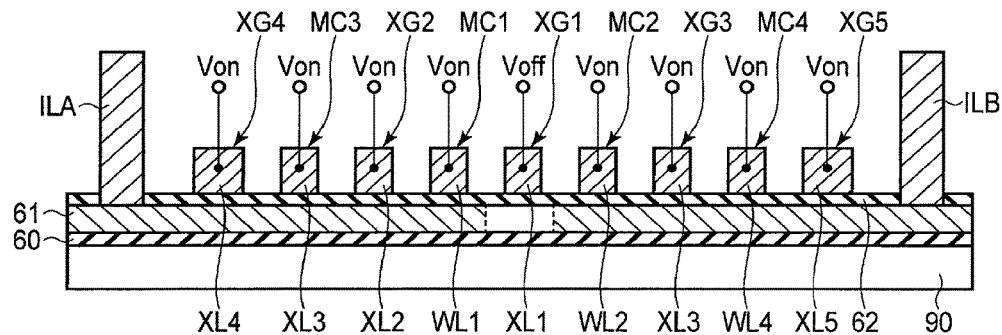

As depicted in FIG. 13B, among the plurality of cut-off transistors XG, the middle cut-off transistor XG1 is set to the off state. Below the gate electrode XL1 of the cut-off transistor XG1, the oxide semiconductor layer 61 is depleted.

Consequently, for the two memory cells MC1, MC2 sandwiching the cut-off transistor XG1, the charge storage layer of the memory cell MC1 is electrically separated from the charge storage layer of the memory cell MC2 by the cut-off transistor XG1.

Figure 13C:
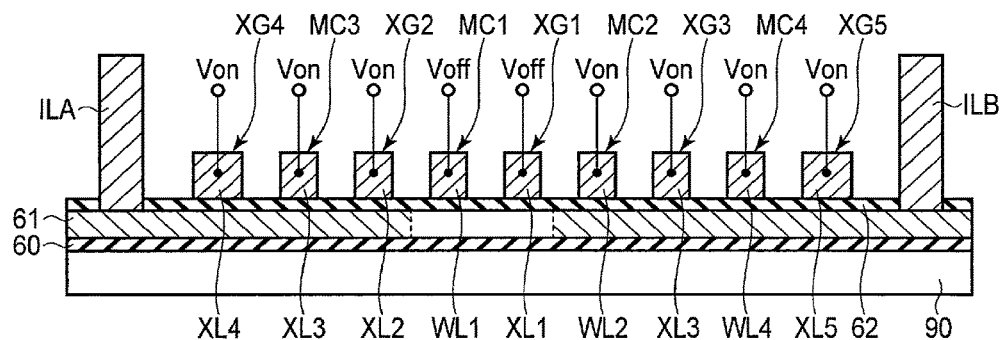

As depicted in FIG. 13C, for example, for the two memory cells MC1, MC2 adjacent to the cut-off transistor XG1, the charge storage layer of the memory cell MC1 is set to the depletion state 999, and the charge storage layer of the memory cell MC2 is set to the accumulation state 995.

In this case, with the positive voltage applied to the injection lines ILA, ILB, a write voltage of 0 V is applied to the gate electrode WL1 of the memory cell MC1, and a write voltage with the voltage value Von is applied to the gate electrode WL2 of the memory cell MC2.

Consequently, the charge storage layer of the memory cell MC1 is depleted, and the charge storage layer of the memory cell MC2 maintains the accumulation state.

The other cut-off transistors XG2, XG3, XG4, XG5 are set to the on state. The charge storage layers CS of the memory cells MC3, MC4 are charged.

As depicted in FIG. 13D, the cut-off transistor XG2 adjacent to the memory cell MC1 is set to the off state. The cut-off transistor XG3 adjacent to the memory cell MC2 is set to the off state.

Consequently, the memory cells MC1, MC2 are electrically separated from the injection line IL1, IL2.

As depicted in FIG. 13E, data is written to the memory cells MC3, MC4.

For example, a write voltage with the voltage value Von is applied to the gate electrode WL3 of the memory cell MC3, and a write voltage of 0 V is applied to the gate electrode WL4 of the memory cell MC4.

With the write voltages applied to the gate electrodes WL3, WL4, the cut-off transistor XG4 and the cut-off transistor XG5 are set to the off state.

Consequently, the memory cells MC3, MC4 are electrically separated from the injection line IL1, IL2. The charge storage layer CS of the memory cell MC3 is set to the accumulation state 995, and the charge storage layer CS of the memory cell MC4 is set to the depletion state.

The potentials of the control gate electrodes WL1, WL2, WL3, WL4 are set to the electrically floating state. Thus, the memory cells MC1, MC2, MC3, MC4 are set to the data holding state.

An example of a write operation different from the write operation in FIG. 13A to FIG. 13E will be described using FIG. 14A to FIG. 14E.

Like the write operation described with reference to FIG. 6A to FIG. 6F, the write operation in FIG. 14A to FIG. 14E illustrates an operation example where the initial state of the oxide semiconductor layer 61 in the sequential access memory in FIG. 11 and FIG. 12 is set to the depletion state.

As depicted in FIG. 14A, the off voltage is applied to the gate electrodes of the cut-off transistors XG and the memory cells MC. For example, a positive voltage is applied to the injection lines ILA, ILB.

Consequently, electrons are discharged from inside the oxide semiconductor layer 61 to the injection lines ILA, ILB. The oxide semiconductor layer 61 is set to the depletion state.

As depicted in FIG. 14B, the injection line ILA-side cut-off transistor XG4 and the injection line ILB-side cut-off transistor XG5 are controllably turned on or off in order to perform charge transfer which allows for data write.

The cut-off transistor XG4 connected to the source-side (source line SL-side) injection line ILA of the memory cell string MS is set to the off state. Below the gate electrode XL4, the oxide semiconductor layer 61 is depleted, and the channel region of the cut-off transistor XG4 is brought into the depletion state.

The cut-off transistor XG5 connected to the drain-side (bit line BL-side) injection line ILB of the memory cell string MS is set to the on state. A channel is formed below the gate electrode XL5, and the channel region of the cut-off transistors XG5 is brought into the accumulation state 995.

As depicted in FIG. 14C, the off voltage Voff is applied to the gate electrode WL3 of the memory cell MC3, and the on voltage Von is applied to the gate electrode WL4 of the memory cell MC4. Subsequently, the cut-off transistors XG4, XG5 are set to the off state.

Charge transfer between the cut-off transistors XG and the memory cells MC allows the charge storage layer CS of the memory cell MC3 to be set to the depletion state 999, while allowing the charge storage layer CS of the memory cells MC4 to be set to the accumulation state 995.

At a point in time in FIG. 14C, data corresponding to the charge storage layers CS of the memory cells MC3, MC4 are written to the memory cells MC1, MC2, respectively.

As depicted in FIG. 14D, the cut-off transistors XG2, XG3, XG4, XG5 control the potentials of the gate electrodes XL2, XL3, XL4, XL5.

For example, the off voltage Voff is applied to the gate electrode XL2 of the cut-off transistor XG2, and the on voltage Von is applied to the gate electrode XL3 of the cut-off transistor XG3.

The channel region of the cut-off transistor XG2 in the off state is kept in the depletion state 999.

The channel region of the cut-off transistor XG3 in the on state is electrically connected to the charge storage layer CS of the memory cells MC3. With the transistor XG3 on, the voltage value Voff is applied to the gate electrode WL4 of the memory cell MC4. Consequently, electrons are transferred from the charge storage layer CS of the memory cell MC4 to the channel region of the cut-off transistor XG3.

The on voltage Von is applied to the gate electrode XL4 of the cut-off transistor XG4. Consequently, the channel region of the cut-off transistor XG4 is set to the accumulation state 995.

The off voltage Voff is applied to the gate electrode XL5 of the cut-off transistor XG5. Consequently, the channel region of the cut-off transistor XG5 maintains the depletion state.

As depicted in FIG. 14E, the potentials of the gate electrodes WL1, WL2, WL3, WL4 of the memory cells MC1, MC2, MC3, MC4 are each controlled.

The off voltage Voff is applied to the gate electrode WL1. Consequently, the charge storage layer CS of the memory cell MC1 is set to a depletion state 999.

The on voltage Von is applied to the gate electrode WL2. Consequently, the charge storage layer CS of the memory cell MC2 is electrically connected to the channel region of the cut-off transistor XG3, which is in the accumulation state. The charge storage layer CS of the memory cell MC2 is set to an accumulation state 995.

The on voltage Von is applied to the gate electrode WL3. Consequently, the charge storage layer CS of the memory cell MC3 is electrically connected to the channel region of the cut-off transistor XG4, which is in the accumulation state. The charge storage layer CS of the memory cell MC3 is set to an accumulation state 995.

The voltage Voff is applied to the gate electrode WL4. Consequently, the charge storage layer CS of the memory cell MC1 is set to the depletion state.

Subsequently, the off voltage Voff is applied to the gate electrodes XL1, XL2, XL3, XL4, XL5 of the cut-off transistors.

The cut-off transistors XG1 to XG5 in the off state electrically separate the charge storage layers CS of the memory cells MC1 to MC4 from one another in accordance with the memory cells MC1 to MC4.

Consequently, the state of the charge storage layer of each of the memory cells MC1 to MC4 is set to the state 995 or 999 according to the data to be written.

Subsequently, the potentials of the control gate electrodes WL1, WL2, WL3 are set to the electrically floating state.

Thus, the memory cells MC1, MC2, MC3, MC4 are set to the data holding state.

As described above, in the semiconductor memory of the present embodiment, the injection lines are connected to the respective ends of the oxide semiconductor layer 61 in the memory cell string MS to allow data to be written to the oxide semiconductor layer 61 through the first end side and the second end side thereof. In the semiconductor memory of the present embodiment, data can be simultaneously written to the two memory cells MC by supplying and emitting charge to and from the oxide semiconductor layer 61 through the first end side and the second end side thereof.

As a result, the semiconductor memory of the present embodiment enables a reduction in the period of time for the write operation and an increase in the speed of the write operation.

As described above, the semiconductor memory of the present embodiment allows operating characteristics to be improved.

[3] Third Embodiment

With reference to FIG. 15 to FIG. 18, a semiconductor memory of a third embodiment will be described.

Basic Example

Figure 15:
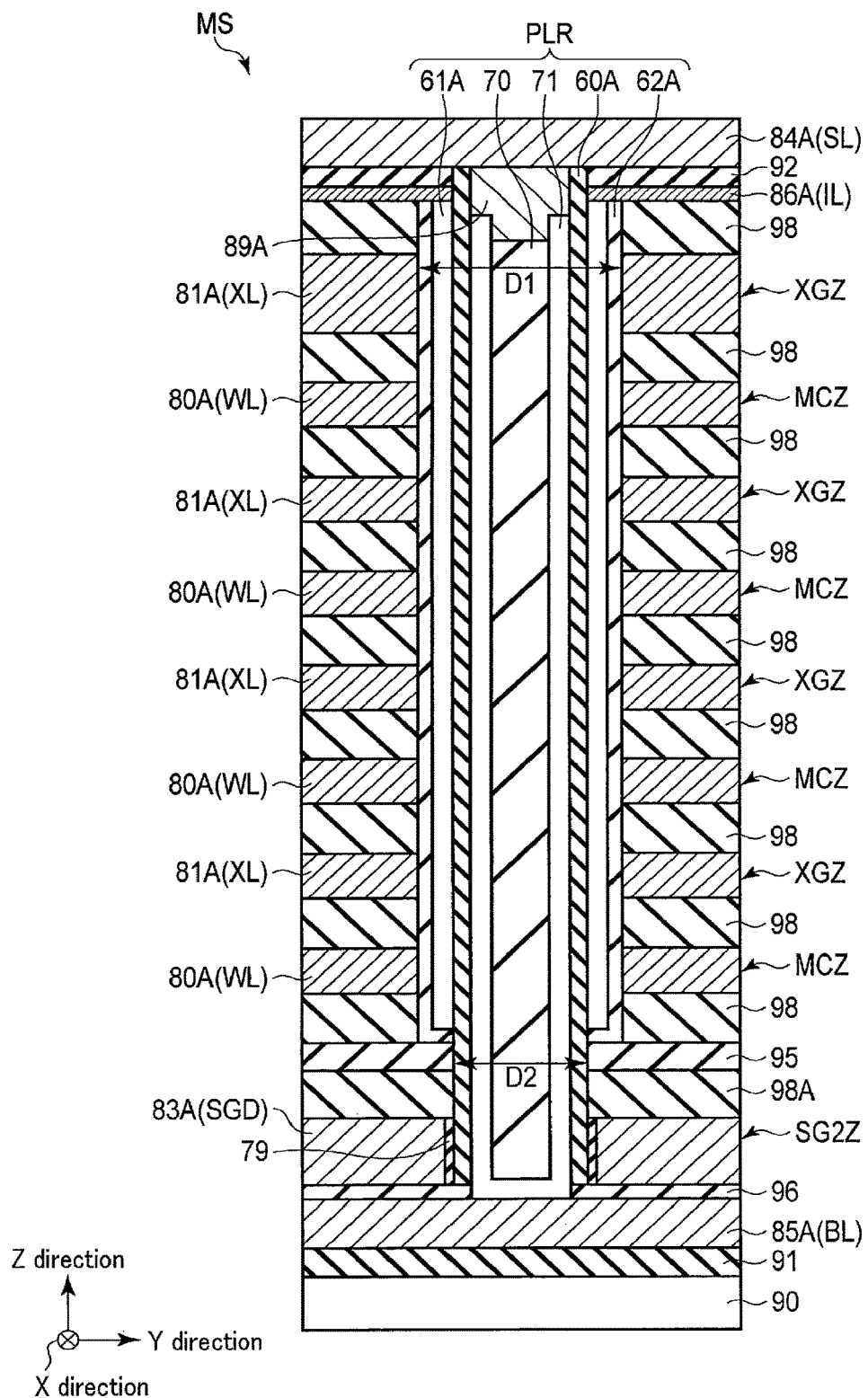
FIG. 15 is a cross-sectional view illustrating a semiconductor memory of a third embodiment.

FIG. 15 is a cross-sectional view depicting the structure of a memory cell string in the semiconductor memory of the present embodiment. FIG. 16 is a top view depicting the structure of the memory cell string in the semiconductor memory of the present embodiment.

As depicted in FIG. 15, the memory cell string MS may include a plurality of memory cells MC stacked substantially perpendicularly to the front surface of the substrate. In this case, the memory cell array has a three-dimensional structure.

In the memory cell array with the three-dimensional structure, the memory cell string MS includes a pillar PLR with an oxide semiconductor layer and a plurality of stacked conductive layers (interconnects) 80A, 81A.

The conductive layers 80A, 81A are stacked in a Z direction perpendicular to the front surface (X-Y plane) of the substrate 90. Insulating layers 98 are each provided between the conductive layers 80A, 81A adjacent to each other in the Z direction. The insulating layers 98 electrically separate the conductive layers 80A, 81A from one another.

The conductive layers 80A serving as the word lines WL and the conductive layers 81A serving as the cut-off gate lines XL are alternately stacked in the Z direction.

A conductive layer 83A serving as the select gate line SGD is provided on an insulating layer 96 on a conductive layer (bit line BL) 85A.

Insulating layers 95, 98, 98A are provided between the lowermost word line WL and the select gate line SGD.

A conductive layer 84A serving as the source line SL is provided above the word line WL in the uppermost layer. The conductive layer 85A serving as the bit line BL is provided on an insulating layer 91 on the substrate 90. A conductive layer 86A serving as the injection line IL is provided between the uppermost insulating layer 98 and an insulating layer 92.

The memory cells MC are provided at intersections of the pillar PLR and the conductive layers 80A.

The cut-off transistors XG are provided at intersections of the pillar PLR and the conductive layers 81A.

A select transistor SG2Z is provided at an intersection of the pillar PLR and the conductive layer 85A.

For example, the conductive layers 80A, 81A extend in the X direction. The conductive layers 85A, 86A extend in the Y direction.

The pillar PLR is formed in a hole (through-hole) formed in the conductive layers 80A, 81A and the insulating layers 91, 95, 96, 98. For example, the pillar PLR has a cylindrical structure.

In this case, as depicted in FIG. 16, the pillar PLR includes a plurality of layers (films) disposed concentrically using the Z direction as a central axis. In this case, a plurality of layers 71, 60A, 61A, 62A is provided between a central portion (axial portion) of the pillar PLR and the conductive layers WL (and the conductive layers XG).

The layer 70 has a cylindrical structure. The layer 70 is an insulator. For example, the layer 70 is a silicon oxide layer.

The layer 71 is provided on a side surface (a surface extending in a direction parallel to an X-Y plane) of the layer 70. The layer 71 is provided between the layer 70 and the layer 60A. The layer 71 has a cylindrical structure.

A material for the layer 71 is a semiconductor. The layer 71 is hereinafter referred to as the semiconductor layer 71.

The material for the semiconductor layer 71 is selected from polycrystalline silicon (Si), polycrystalline germanium (Ge), polycrystalline silicon germanium (SiGe), a two-dimensional semiconductor material (for example, $MoS_2$ or $WSe_2$), and the like. A stack film of silicon and germanium may be used for the semiconductor layer 71.

The layer 60A is provided on a side surface (outer peripheral surface) of the layer 71. The layer 60A is provided between the layer 71 and the layer 61A. The layer 60A has a cylindrical structure.

The layer 60A is an insulator. The layer 60A is hereinafter also referred to as the insulating layer.

For example, a material for the insulating layer 60A is selected from silicon oxide, silicon oxynitride, and a high-dielectric material (for example, aluminum oxide, hafnium oxide, or zirconium oxide). The insulating layer 60A may be a mixture film or a stack film of these materials.

The insulating layer 60A has a film thickness set within a range from approximately 1 nm to approximately 10 nm. For example, the insulating layer 60A preferably has a film thickness within a range from 3 nm to 7 nm.

The layer 61A is provided on a side surface (outer peripheral surface) of the layer 60A. The layer 61A is provided between the layer 60A and the layer 62A. The layer 61A has a cylindrical structure.

The layer 61A is an oxide semiconductor layer. A material for the oxide semiconductor layer 61A is an oxide of In, Ga, Zn, or Sn or a mixture (compound) thereof. For example, the material for the oxide semiconductor layer 61A is InGnZnO. The material used for the oxide semiconductor layer 61A may be used for the semiconductor layer 71.

The oxide semiconductor layer 61A has a film thickness set within a range from approximately 1 nm to approximately 15 nm. For example, the oxide semiconductor layer 61A preferably has a film thickness within a range from 3 nm to 10 nm.

The layer 62A is provided on a side surface (outer peripheral surface) of the layer 61A. The layer 62A is provided between the oxide semiconductor layer 61A and the conductive layers 80A, 81A and insulating layer 89. The layer 62A has a cylindrical structure.

The layer 62A is an insulator. The layer 62A is hereinafter also referred to as the insulating layer.

A material for the insulating layer 62A may be the same as the material for the insulating layer 60A. The insulating layer 62A has a film thickness set equivalent to the film thickness of the gate insulating film 60A. However, the material for the insulating layer 62A may be different from the material for the insulating layer 60A. The film thickness of the insulating layer 62A may be different from the film thickness of the insulating layer 60A.

The film thickness of each of the layers 71, 60A, 61A, 62A is a thickness with respect to a direction parallel to the X-Y plane.

On a bottom side of the pillar PLR, the semiconductor layer 71 is provided on the upper surface of the conductive layer 85A. The semiconductor layer 71 is sandwiched between a bottom portion of the insulating layer 70 and an upper surface of the conductive layer 83.

The semiconductor layer 71 is connected to the source line SL via the source line contact 89A.

A bottom portion of the oxide semiconductor layer 61A in the Z direction is provided on an upper surface of the insulating layer 95 via the insulating layer 62A. An oxide semiconductor layer 61Z is separated from the bit line BL by the insulating layer 95.

An upper portion of the oxide semiconductor layer 61A in the Z direction is in contact with the injection line IL.

The source line SL may be electrically connected to the injection line IL.

The source line SL may function as the injection line IL. If the source line SL functions as the injection line IL, the injection line IL is not formed. The source line SL is in direct contact with the oxide semiconductor layer 61A.

Memory cells MCZ are field effect transistors each including the charge storage layer CS.

The oxide semiconductor layer 61A is used as the charge storage layer CS.

The semiconductor layer 71 is used as channel regions of the memory cells MC. The insulating layer 60A is used as a gate insulating film for the transistors MC. An insulating layer 62A is used as a block insulating film configured to separate the conductive layers (gate electrodes) 81A from the oxide semiconductor layer (charge storage layer) 61A.

The cut-off transistors XGZ include members located near intersections of the pillar PLR and the conductive layers 81A.

In each of the transistors XGZ, the oxide semiconductor layer 61A is used as a channel region. In each transistor XGZ, the insulating layer 62A is used as a gate insulating film for the oxide semiconductor layer 61A.

For example, one of the plurality of cut-off transistors XGZ that is provided at the uppermost layer interconnect level may be used as a source-side select transistor. The source-side select transistor may be provided between the uppermost-layer cut-off transistor XGZ and the source line SL.

In the transistor XGZ, the semiconductor layer 71 may function as a parasitic channel region in accordance with an operation of the transistor XGZ. To suppress the parasitic channel of the transistor XGZ, a negative voltage is applied to the gate electrode 81A of the transistor XGZ.

A select transistor SG2Z is disposed at the bottom side of the pillar PLR and includes a member located near an intersection of the conductive layer 85A and the pillar PLR.

In the select transistor SG2Z, the insulating layer 60A serving as the gate insulating film for the select transistor SG2Z and an insulating layer 79 are provided between the conductive layer 83A serving as the gate electrode (select gate line SGD) and the semiconductor layer 71. However, one of the insulating layer 60A and the insulating layer 79 need not be provided between the conductive layer 85A and the semiconductor layer 71.

The oxide semiconductor layer 61A is not provided between the conductive layer 83A and the semiconductor layer 71.

The oxide semiconductor layer 61A and the insulating layer 62A are not provided in a part of the pillar PLR which is located below an upper surface of the insulating layer 95.

In an area from an opening in the insulating layer 95 to an upper surface of the conductive layer (bit line) 85A, the insulating layers 70, 60A and the semiconductor layer 71, included in the components of the pillar PLR, are provided.

An opening dimension D2 of the opening in the insulating layer 95 is smaller than an opening dimension D1 of the through-hole at an upper portion of the stack.

The semiconductor memory of the present embodiment is formed using a well-known technique.

The select transistors SG2 not including the oxide semiconductor layer 61A is formed as follows.

The insulating layer 95 is used as an etching stopper configured to provide the through-hole to be formed in the stack with different opening dimensions D1, D2.

After the layers 60A, 61A, 62A are formed with respect to the through-hole formed in the stack and before the layers 70, 71 are formed, anisotropic etching is executed on the layers 60A, 61A, 62A. Due to a difference in height between the insulating layer 98 and the insulating layer 95 resulting from a difference between the opening dimensions D1, D2, the layers 60A, 61A, 62A are selectively removed from an area below the insulating layer 89.

As a result, in the select transistor SG2Z, the oxide semiconductor layer 61A and the insulating layer 62A are not formed between the conductive layer 83A and the semiconductor layer 71.

In the semiconductor memory of the present embodiment (for example, a sequential random access memory), for example, the memory cells MCZ are configured to exhibit characteristics of normally on transistors when no charge is accumulated in the oxide semiconductor layer 61A (depletion state). Thus, the semiconductor layer 71 is, for example, an n-type polysilicon layer.

In this case, at each of the positions of the cut-off transistors XGZ and the select transistor SG2D, a normally on transistor including the n-type semiconductor layer 71 as a channel region is formed.

For example, a negative bias circuit is provided in the semiconductor memory of the present embodiment in order to eliminate the channels in the n-type semiconductor layer 71 for the cut-off transistors XGZ and the select transistor SG2Z (to set the channels to the off state).

If the channels in the n-type semiconductor layer 71 for the cut-off transistors XGZ and the select transistor SG2Z are set to the off state, a negative voltage is applied to the gate electrodes 81A, 83A.

Consequently, the connection between the bit line BL and the source line SL can be prevented for the unselected strings.

The memory cells MCZ are configured to exhibit characteristics of normally off transistors when charge is accumulated in the oxide semiconductor layer 61A (accumulation state).

Circuit Example

A circuit configuration of the memory cell array in the semiconductor memory of the present embodiment will be described using FIG. 17.

Figure 17:
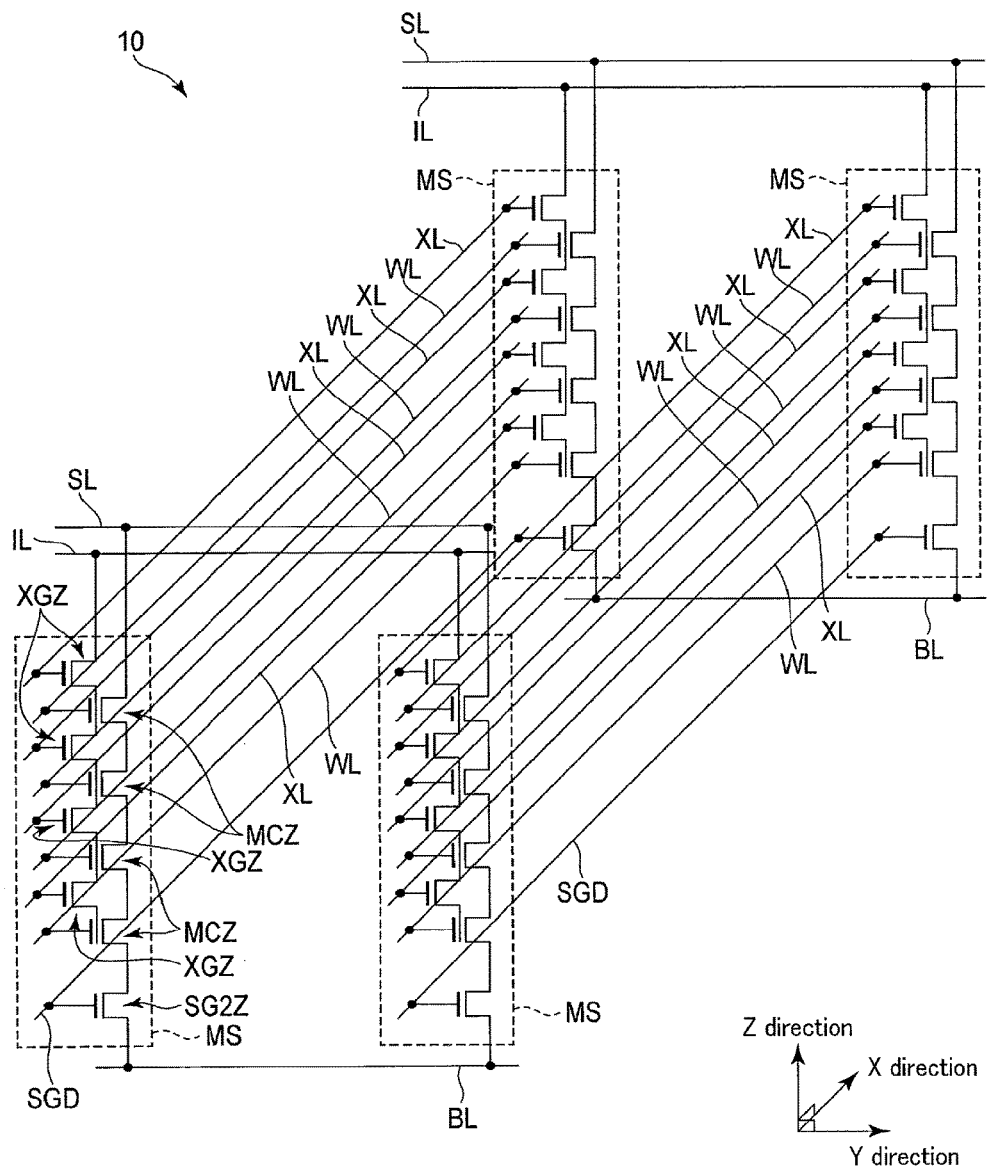
FIG. 17 is a circuit diagram illustrating the semiconductor memory of the third embodiment.

FIG. 17 is an equivalent circuit diagram illustrating a circuit configuration of a memory cell array with a three-dimensional structure. In FIG. 17, for simplification of illustration, a 2×2 memory cell string included in a m×n memory cell string in the memory cell array is depicted.

As depicted in FIG. 17, a plurality of memory cell strings MS arrayed in the X direction is connected to a common select gate line SGD. A plurality of memory cell strings MS arrayed in the Y direction is connected to different select gate lines SGD.

In the plurality of memory cell strings MS arrayed in the X direction, memory cells MC within the same interconnect level are connected to a common word line WL.

For example, the memory cells MCZ arrayed in the Y direction are connected to different word lines.

The plurality of memory cell strings MS arrayed in the Y direction is connected to a common bit line BL. The plurality of memory cell strings MS arrayed in the X direction is connected to different bit lines BL.

The plurality of memory cell strings MS arrayed in the Y direction is connected to a common source line SL. The plurality of memory cell strings MS arrayed in the X direction is connected to different source lines SL.

The plurality of memory cell strings MS arrayed in the Y direction is connected to a common injection line IL. The plurality of memory cell strings MS arrayed in the X direction is connected to different injection lines IL.

The common lines IL for the plurality of memory cell strings MS arrayed in the X direction are independent of one another, and thus, predetermined data can be written to each of the plurality of memory cells MCZ sharing the word line WL.

A write operation and a read operation on the memory cells MCZ in the memory cell array with the three-dimensional structure are substantially the same as the write operation and the read operation on the memory cells in the memory cell array with the two-dimensional structure.

Modification

A modification of the semiconductor memory of the present embodiment will be described using FIG. 18.

FIG. 18 is a cross-sectional view depicting a modification of the memory cell string in FIG. 15.

As depicted in FIG. 18, the oxide semiconductor layer 61A is provided between the gate electrode 83A of the select transistor SG2X and the semiconductor layer 71.

However, the oxide semiconductor layer 61A is not in contact with the bit lines BL.

The select transistor SG2X has substantially the same structure as that of the cut-off transistors XGZ.

For example, the cut-off transistor XGZ is provided between the select transistor SG2X and the memory cell MCZ.

The select transistor SG2X is preferably a normally off transistor.

Therefore, in the memory cell string MS in FIG. 18, a write operation on the oxide semiconductor layer 61A of the select transistor SG2X sets the inside of the oxide semiconductor layer 61A of the select transistor SG2X to the accumulation state such that electrons are constantly accumulated in a part of the oxide semiconductor layer 61A which lies opposite to the select transistor SG2X.

The cut-off transistors XGZ between the select transistor SG2X and the memory cell MCZ is set to the off state to allow the oxide semiconductor layer 61A of the select transistor SG2X to maintain the accumulation state.

Conclusion

The semiconductor memory of the second embodiment has the memory cell array with the three-dimensional structure.

The semiconductor memory of the present embodiment can produce effects similar to the effects of the above-described other embodiments.

The semiconductor memory of the present embodiment allows the storage density of the memory to be improved by the three-dimensional structure of the memory cell array.

As a result, the semiconductor memory of the present embodiment enables a reduction in bit cost.

(4) Miscellaneous

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a semiconductor layer;
    a gate insulating film on the semiconductor layer;
    a first gate electrode of a first select transistor on the gate insulating film;
    a second gate electrode of a second select transistor on the gate insulating film;
    an oxide semiconductor layer disposed above the semiconductor layer between the first and second select transistors via the gate insulating film;
    an insulating layer on the oxide semiconductor layer;
    a first control gate electrode of a first memory cell on the insulating layer;
    a second control gate electrode of a second memory cell on the insulating layer;
    a third gate electrode of a first transistor on the insulating layer between the first control gate electrode and the second control gate electrode;
    a fourth gate electrode of a second transistor on the insulating layer between a first end of the oxide semiconductor layer and the second control gate electrode;
    a first interconnect connected to the first end of the oxide semiconductor layer;
    a source line connected to a first terminal of the first select transistor; and
    a bit line connected to a second terminal of the second select transistor.

2. The memory according to claim 1, wherein the first memory cell includes a first charge storage layer in the oxide semiconductor layer, and
    the second memory cell includes a second charge storage layer in the oxide semiconductor layer.

3. The memory according to claim 2, wherein a threshold voltage of the first memory cell varies according to a quantity of charge in the first charge storage layer,
    the first memory cell holds first data when the threshold voltage of the first memory cell has a first value, and
    the first memory cell holds second data which is different from the first data when the threshold voltage of the first memory cell has a second value which is different from the first value.

4. The memory according to claim 1, wherein the first transistor includes a first channel region in the oxide semiconductor layer, and
    the second transistor includes a second channel region in the oxide semiconductor layer.

5. The memory according to claim 1, wherein the first memory cell includes first source/drain regions in the semiconductor layer, and the second memory cell includes second source/drain regions in the semiconductor layer.

6. The memory according to claim 5, wherein the third gate electrode is disposed above one of the first source/drain regions, and
    the fourth gate electrode is disposed above one of the second source/drain regions.

7. The memory according to claim 1, further comprising:
    a fifth gate electrode of a third transistor on the insulating layer between a second end of the oxide semiconductor layer and the first control gate electrode; and
    a second interconnect connected to the second end of the oxide semiconductor layer.

8. The memory according to claim 1, wherein the oxide semiconductor layer includes at least one of indium (In), gallium (Ga), zinc (Zn), and tin (Sn).

9. The memory according to claim 1, wherein charge is supplied to the oxide semiconductor layer through the first interconnect.

10. A semiconductor memory comprising:
    a pillar disposed on a substrate and extending in a first direction, the pillar including an oxide semiconductor layer;
    a first conductive layer, a second conductive layer, a third conductive layer, a fourth conductive layer, and a fifth conductive layer disposed on the substrate along the first direction and opposite to a side surface of the pillar;
    a select transistor disposed at an intersection of the first conductive layer and the pillar;
    a first memory cell disposed at an intersection of the second conductive layer and the pillar;
    a first transistor disposed at an intersection of the third conductive layer and the pillar;
    a second memory cell disposed at an intersection of the fourth conductive layer and the pillar;
    a second transistor disposed at an intersection of the fifth conductive layer and the pillar;
    a bit line connected to a first end of the pillar in the first direction;
    a source line connected to a second end of the pillar in the first direction; and
    an interconnect connected to the oxide semiconductor layer.

11. The memory according to claim 10, wherein the first memory cell includes a first charge storage layer in the oxide semiconductor layer, and
    the second memory cell includes a second charge storage layer in the oxide semiconductor layer.

12. The memory according to claim 11, wherein a threshold voltage of the first memory cell varies according to a quantity of charge in the first charge storage layer,
    the first memory cell holds first data when the threshold voltage of the first memory cell has a first value, and
    the first memory cell holds second data which is different from the first data when the threshold voltage of the first memory cell has a second value which is different from the first value.

13. The memory according to claim 10, wherein the first transistor includes a first channel region in the oxide semiconductor layer, and
    the second transistor includes a second channel region in the oxide semiconductor layer.

14. The memory according to claim 10, wherein the pillar includes a semiconductor layer extending in the first direction,
- the oxide semiconductor layer is disposed between the semiconductor layer and the second to fifth conductive layers,
- the first memory cell includes a third channel region in the semiconductor layer,
- the second memory cell includes a fourth channel region in the semiconductor layer, and
- the select transistor includes a fifth channel region in the semiconductor layer.

15. The memory according to claim 14, further comprising:
- a sixth conductive layer disposed between the first conductive layer and the second conductive layer; and
- a third transistor disposed at an intersection of the sixth conductive layer and the pillar,
- wherein
  - the oxide semiconductor layer is disposed between the first conductive layer and the semiconductor layer and between the sixth conductive layer and the semiconductor layer.

16. The memory according to claim 10, wherein the interconnect is disposed between the fifth conductive layer and the source line.

17. The memory according to claim 10, wherein
- the bit line is disposed between the first end of the pillar and the substrate, and
- the bit line extends in a second direction parallel to a front surface of the substrate.

18. The memory according to claim 10, wherein the oxide semiconductor layer includes at least one of indium (In), gallium (Ga), zinc (Zn), and tin (Sn).

19. The memory according to claim 10, wherein charge is supplied to the oxide semiconductor layer through the first interconnect.

\* \* \* \* \*